United States Patent
Uchida et al.

(10) Patent No.: US 8,350,387 B2
(45) Date of Patent: Jan. 8, 2013

(54) SEMICONDUCTOR DEVICE AND SEMICONDUCTOR STORAGE DEVICE

(75) Inventors: Kanae Uchida, Yokohama (JP); Masato Endo, Ashigarakami-gun (JP); Kazuyuki Higashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 606 days.

(21) Appl. No.: 12/199,022

(22) Filed: Aug. 27, 2008

(65) Prior Publication Data

US 2009/0091040 A1   Apr. 9, 2009

(30) Foreign Application Priority Data

Aug. 29, 2007  (JP) .................. 2007-222600

(51) Int. Cl.
*H01L 23/52* (2006.01)
(52) U.S. Cl. .............. 257/773; 257/315; 257/760
(58) Field of Classification Search ........... 257/316–326
See application file for complete search history.

(56) References Cited

U.S. PATENT DOCUMENTS

| | | | | |
|---|---|---|---|---|
| 5,357,462 | A * | 10/1994 | Tanaka et al. | 365/185.22 |
| 5,386,422 | A * | 1/1995 | Endoh et al. | 365/185.22 |
| 7,084,469 | B2 * | 8/2006 | Fukuzumi | 257/421 |
| 2003/0020176 | A1 | 1/2003 | Nambu | |
| 2005/0051831 | A1 * | 3/2005 | Kajimoto et al. | 257/314 |
| 2005/0083744 | A1 | 4/2005 | Arai et al. | |
| 2005/0236660 | A1 * | 10/2005 | Watanobe et al. | 257/315 |

FOREIGN PATENT DOCUMENTS

| | | |
|---|---|---|
| JP | 7-283312 | 10/1995 |
| JP | 7-335757 | 12/1995 |
| JP | 9-172067 | 6/1997 |
| JP | 9-172071 | 6/1997 |
| JP | 10-242271 | 9/1998 |
| JP | 2003-45964 | 2/2003 |
| JP | 2005-116970 | 4/2005 |
| JP | 2005-317138 | 11/2005 |

OTHER PUBLICATIONS

U.S. Appl. No. 12/833,329, filed Jul. 9, 2010, Nishihara.
U.S. Appl. No. 12/839,723, filed Jul. 20, 2010, Nishihara.
U.S. Appl. No. 13/405,570, filed Feb. 27, 2012, Toba.

* cited by examiner

*Primary Examiner* — David Vu
*Assistant Examiner* — Jonathan Han
(74) *Attorney, Agent, or Firm* — Oblon, Spivak, McClelland, Maier & Neustadt, L.L.P.

(57) ABSTRACT

A semiconductor storage device includes a memory cell transistor and a selective transistor formed on a semiconductor substrate, a first interlayer insulating film which is formed on the semiconductor substrate, an insulating layer formed by use of a material higher in dielectric constant than the first interlayer insulating film, a contact plug which penetrates the insulating layer and the first interlayer insulating film and which is electrically connected to a drain of the selective transistor, and a bit line which is in contact with the contact plug. A partial region in the bottom surface of the bit line is located lower than the upper surface of the contact plug, and is in contact with the surface of the insulating layer, and the partial region is also in contact with the side surface of the contact plug.

12 Claims, 21 Drawing Sheets

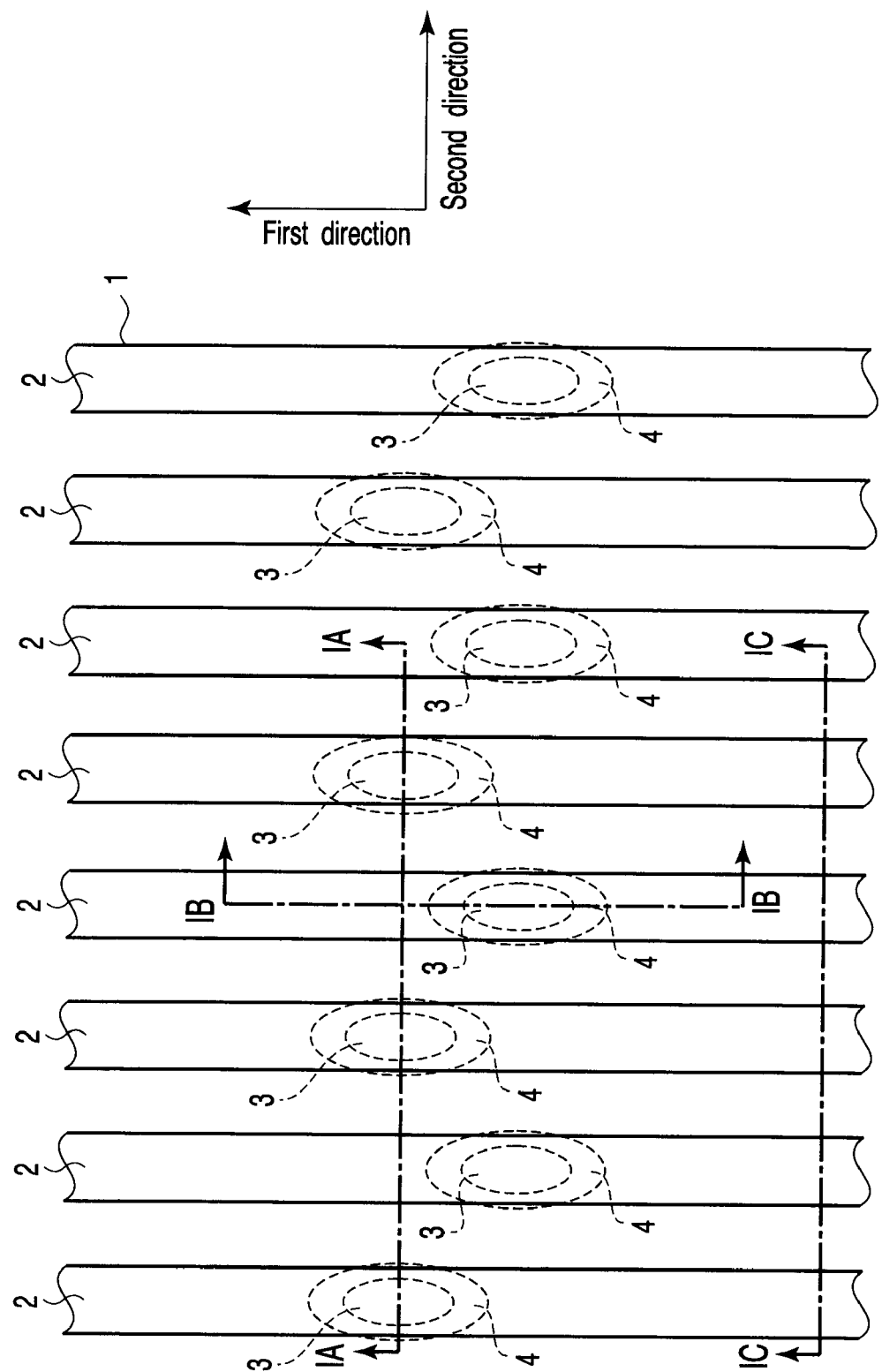
F I G. 1

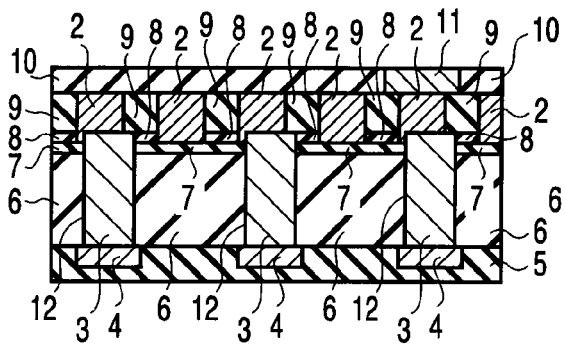
IA-IA section
F I G. 2 A
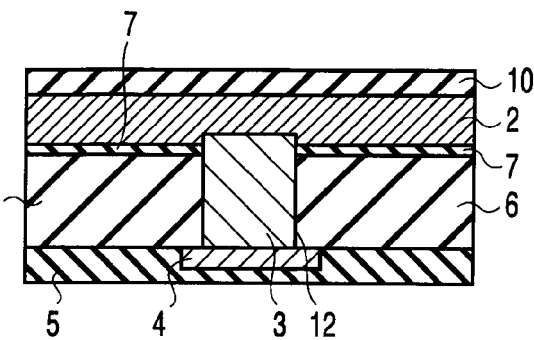
IB-IB section
F I G. 2 B
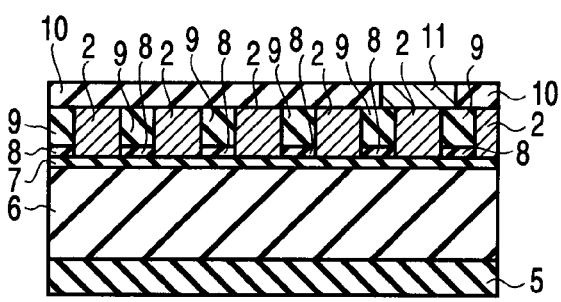
IC-IC section
F I G. 2 C
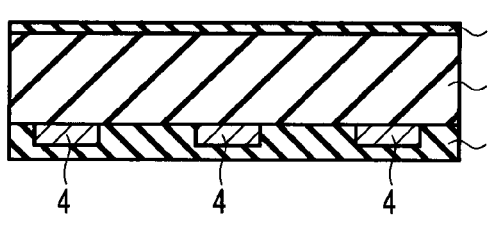
IA-IA section
F I G. 3 A
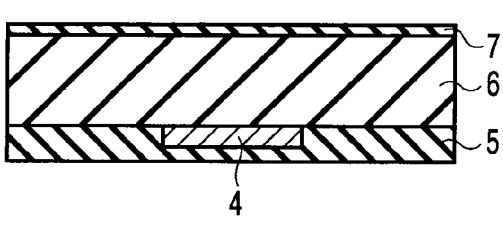
IB-IB section
F I G. 3 B
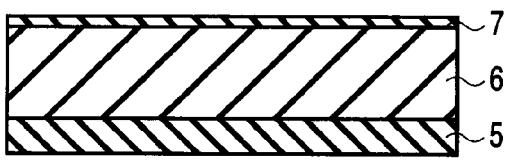
IC-IC section
F I G. 3 C

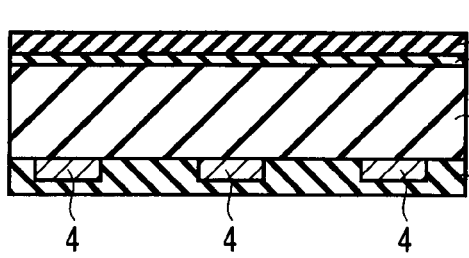
IA-IA section
F I G. 4 A
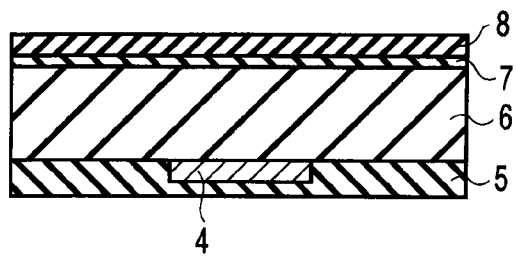
IB-IB section
F I G. 4 B
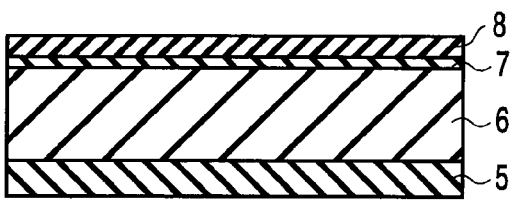
IC-IC section
F I G. 4 C
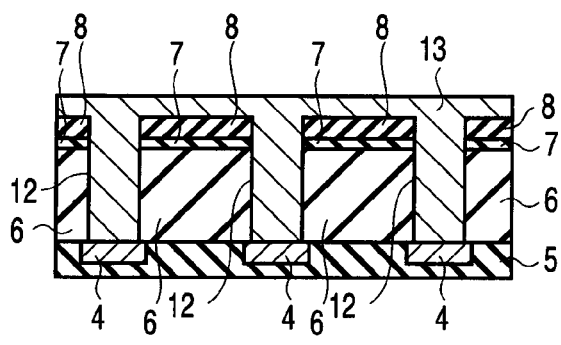
IA-IA section
F I G. 5 A
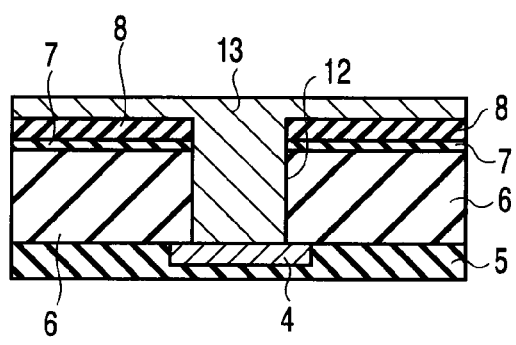
IB-IB section
F I G. 5 B
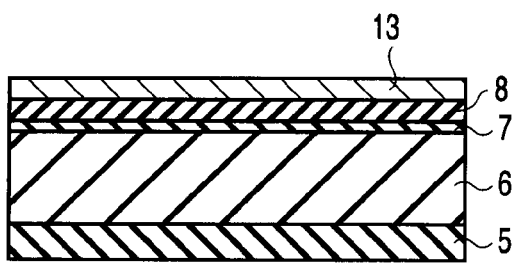
IC-IC section
F I G. 5 C IA-IA section IB-IB section IC-IC section IA-IA section IB-IB section IC-IC section IA-IA section IB-IB section IC-IC section IA-IA section IB-IB section IC-IC section

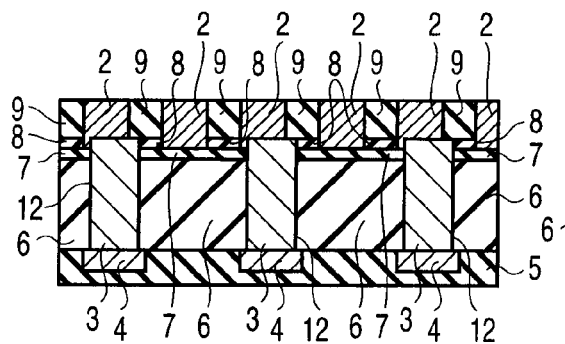
IA-IA section
F I G. 1 0 A
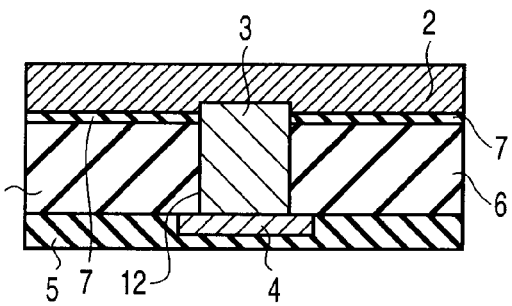
IB-IB section
F I G. 1 0 B
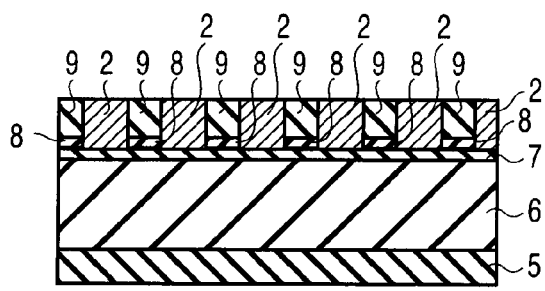
IC-IC section
F I G. 1 0 C
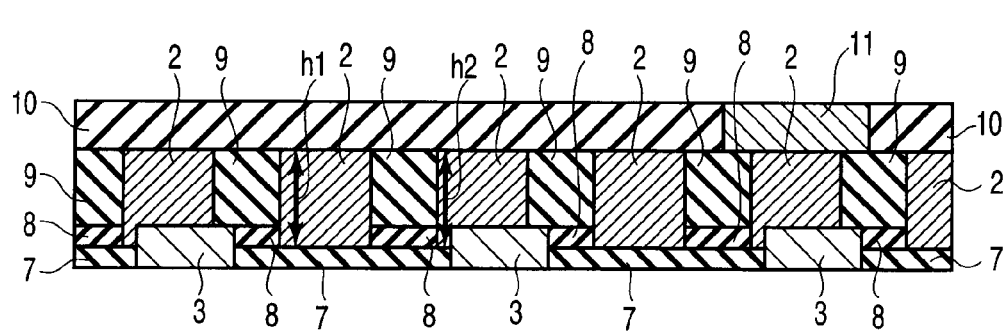
F I G. 1 1
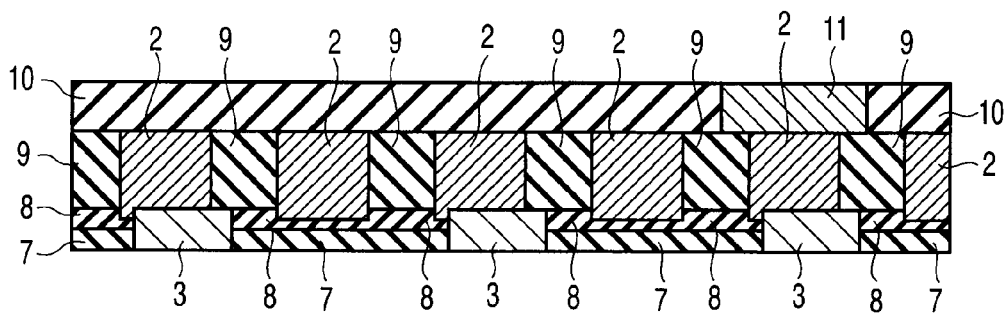
F I G. 1 2

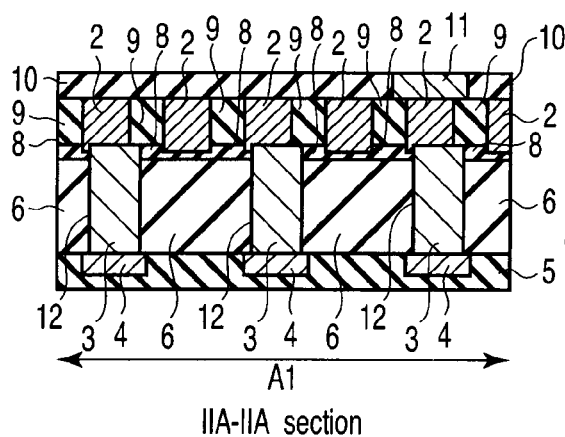
FIG. 14A IIA-IIA section
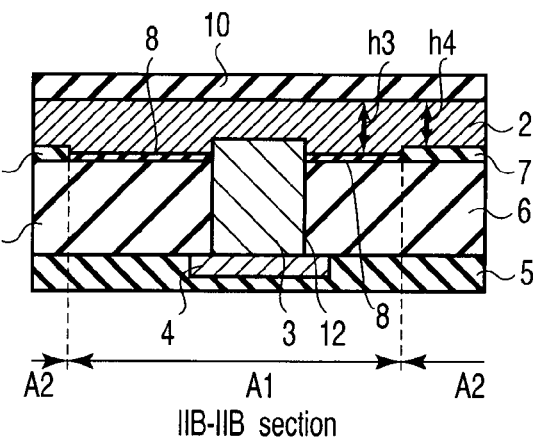
FIG. 14B IIB-IIB section
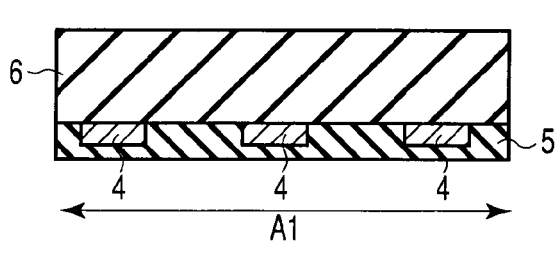
FIG. 15A IIA-IIA section
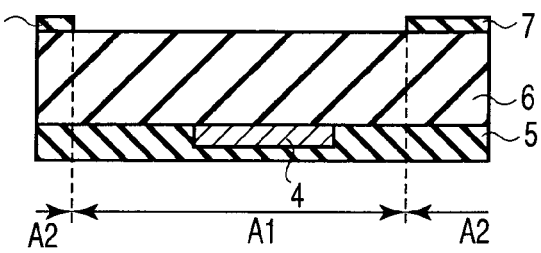
FIG. 15B IIB-IIB section
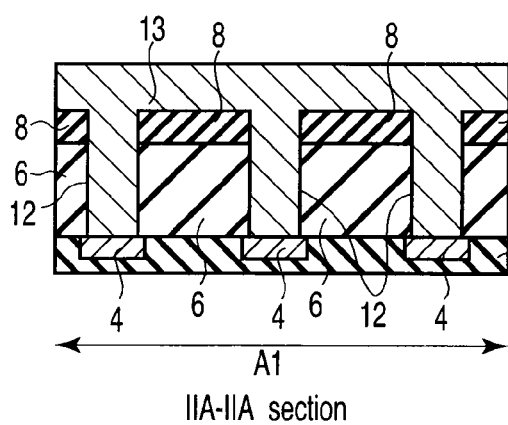
FIG. 16A IIA-IIA section
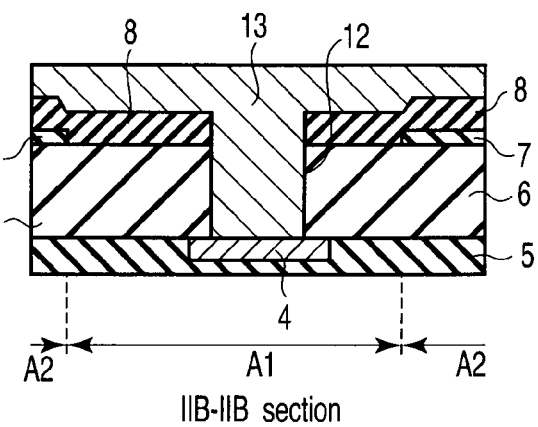
FIG. 16B IIB-IIB section

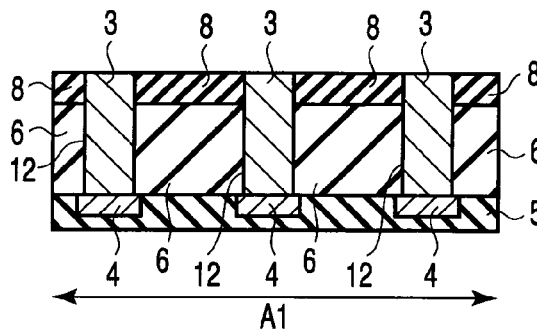
IIA-IIA section
F I G. 17 A
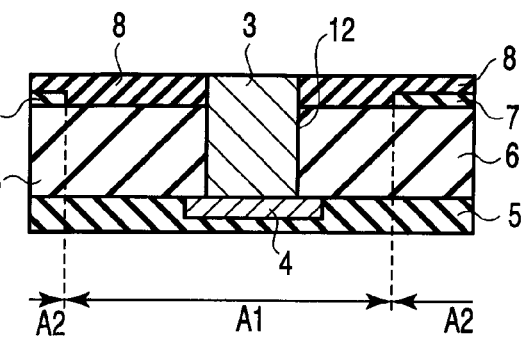
IIB-IIB section
F I G. 17 B
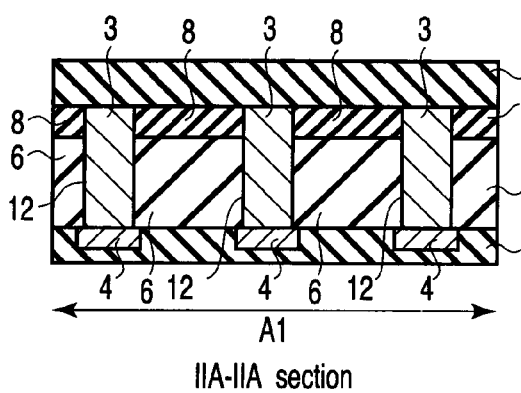
IIA-IIA section
F I G. 18 A
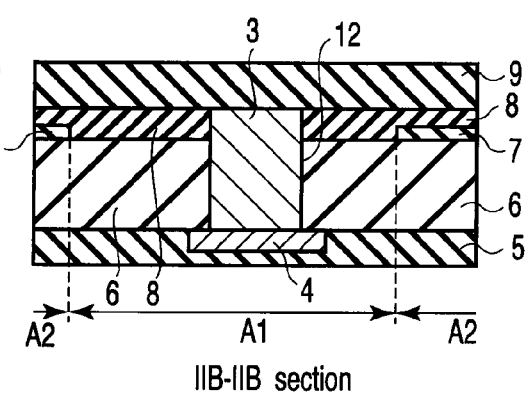
IIB-IIB section
F I G. 18 B
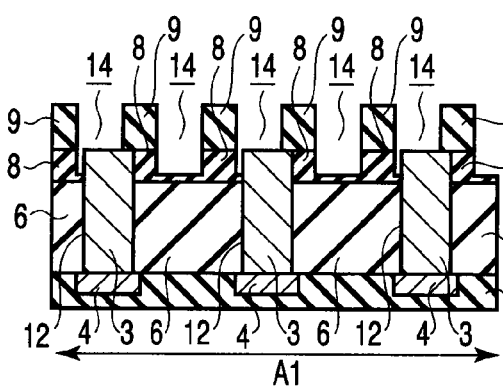
IIA-IIA section
F I G. 19 A
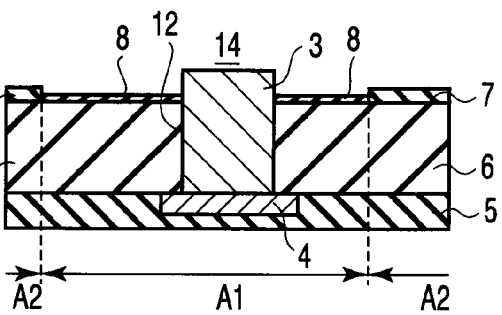
IIB-IIB section
F I G. 19 B IIA-IIA section IIB-IIB section IIA-IIA section IIB-IIB section

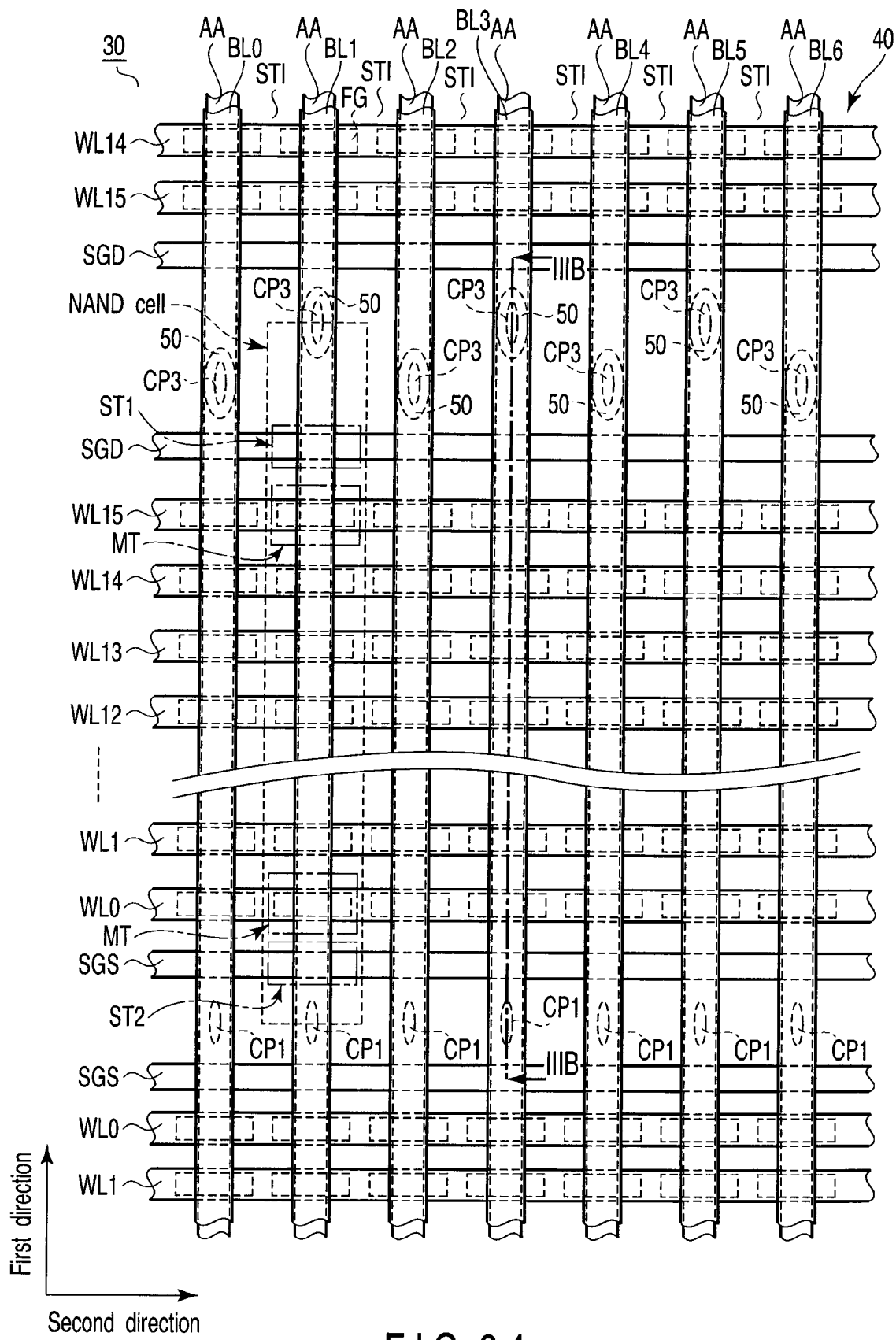
F I G. 2 4

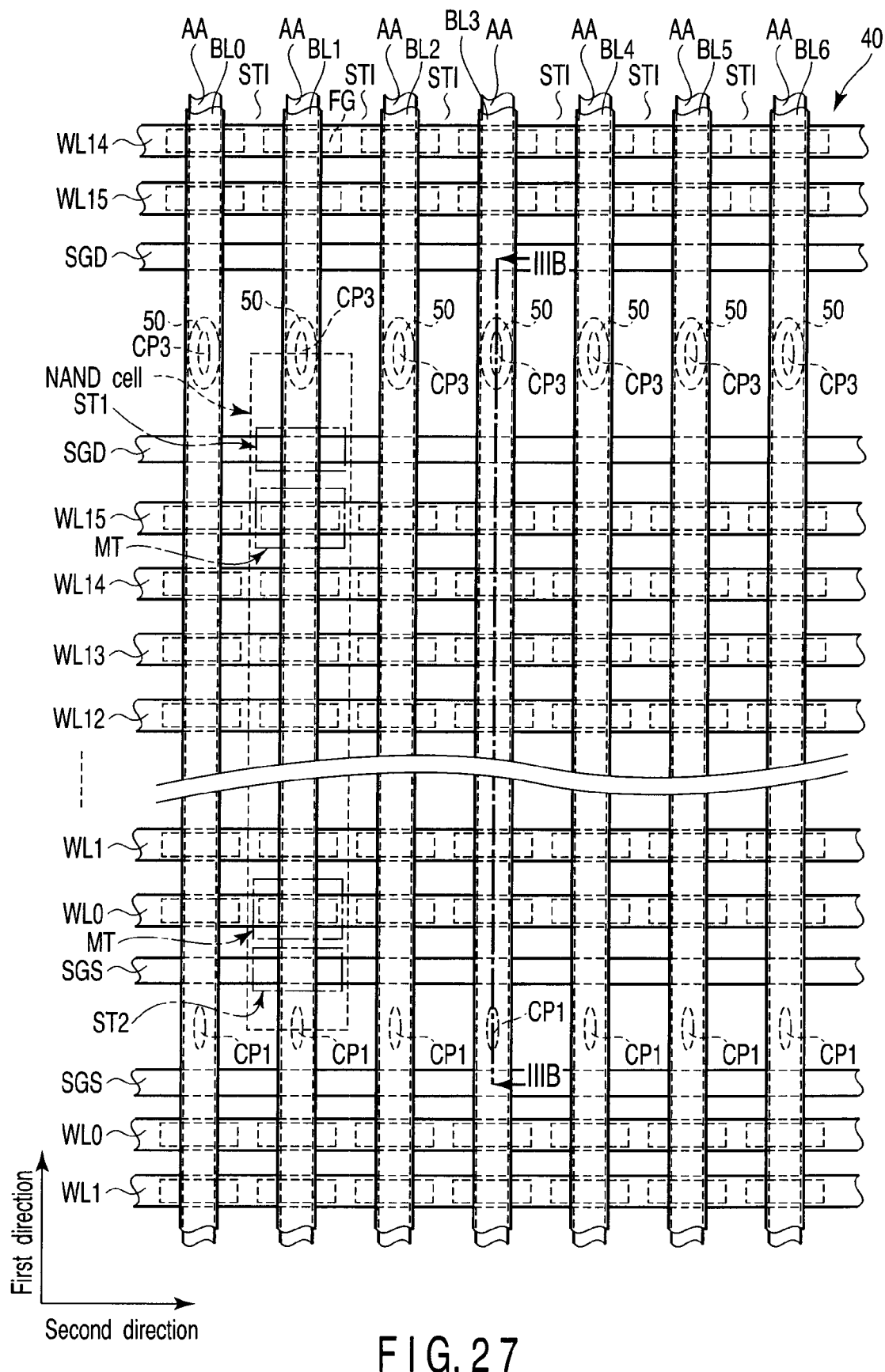
F I G. 27

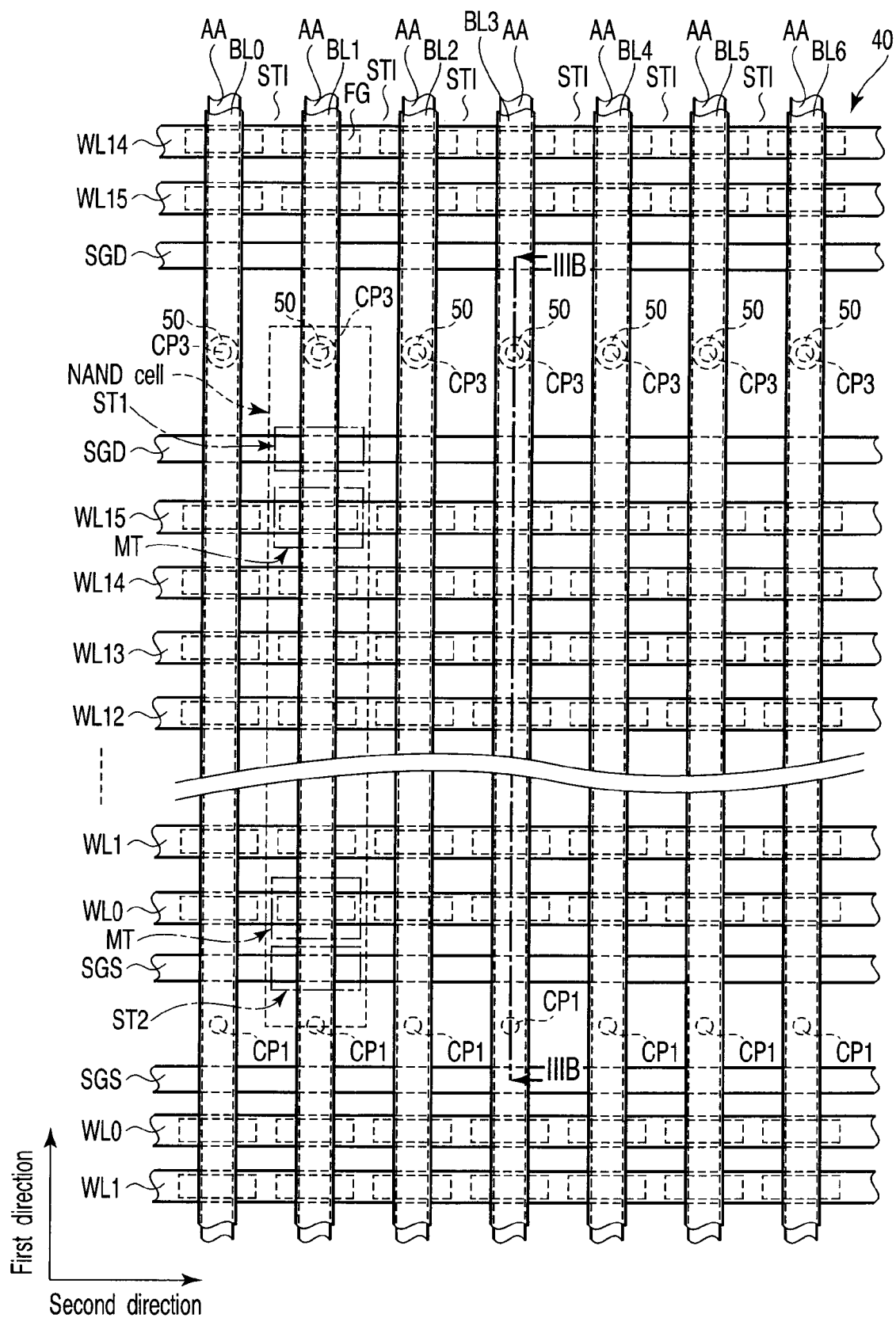
F I G. 28

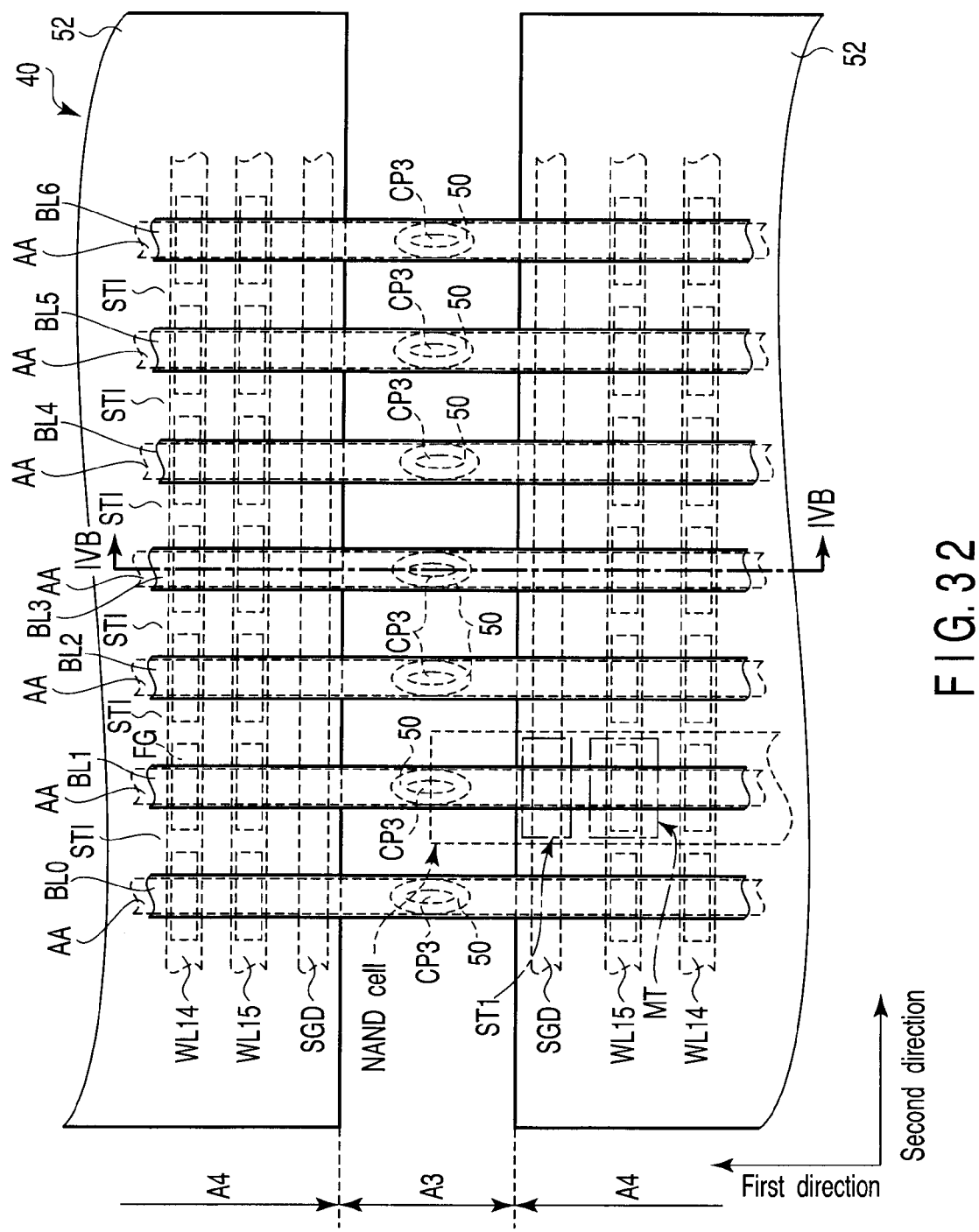
F I G. 32

SEMICONDUCTOR DEVICE AND SEMICONDUCTOR STORAGE DEVICE

CROSS-REFERENCE TO RELATED APPLICATIONS

This application is based upon and claims the benefit of priority from prior Japanese Patent Application No. 2007-222600, filed Aug. 29, 2007, the entire contents of which are incorporated herein by reference.

BACKGROUND OF THE INVENTION

1. Field of the Invention

The present invention relates to a semiconductor device and a semiconductor storage device. More particularly, it relates to the configurations of a contact plug and a wiring line in a NAND type flash memory.

2. Description of the Related Art

There has been remarkable advancement in the recent miniaturization of semiconductor devices. Along with this miniaturization, the wiring width and wiring pitch of a metal wiring layer have been reduced.

A conventional metal wiring layer is formed by, for example, embedding a conducting layer in a groove formed in an interlayer insulating film. In this regard, there is widely used a method of previously forming, in the interlayer insulating film, an insulating film which functions as an etching stopper during the formation of the groove (see, e.g., Jpn. Pat. Appln. KOKAI Publication No. 2005-116970 or Jpn. Pat. Appln. KOKAI Publication No. 2003-045964 or Jpn. Pat. Appln. KOKAI Publication No. 07-335757).

However, the dielectric constant of a material used for the insulating film which functions as the etching stopper is generally higher than that of a material used for the interlayer insulating film. Therefore, if this insulating film is present in the metal wiring layer, the parasitic capacitance between the metal wiring layers increases.

Particularly in the case of a semiconductor memory requiring higher integration, for example, an electrically erasable and programmable read only memory (EEPROM), adjacent bit lines are formed with minimum processing dimensions. This has caused the problem of decreased operation reliability of the semiconductor memory, such as a decreased operation speed, when the parasitic capacitance increases.

BRIEF SUMMARY OF THE INVENTION

According to a first aspect of the present invention, there is provided a semiconductor storage device comprising: a memory cell transistor formed on a semiconductor substrate; a selective transistor which is formed on the semiconductor substrate and whose source is connected to a drain of the memory cell transistor; a first interlayer insulating film which is formed on the semiconductor substrate and which covers the memory cell transistor and the selective transistor; an insulating layer formed in the first interlayer insulating film by use of a material higher in dielectric constant than the first interlayer insulating film; a contact plug which penetrates the insulating layer and which is provided in the first interlayer insulating film and which is electrically connected to a drain of the selective transistor; and a bit line which is formed on the insulating layer and which is in contact with the contact plug, wherein a partial region in the bottom surface of the bit line is located lower than the upper surface of the contact plug, and is in contact with the surface of the insulating layer, and the partial region is also in contact with the side surface of the contact plug.

According to a second aspect of the present invention, there is provided a semiconductor device comprising: a first interlayer insulating film; an insulating layer formed on the first interlayer insulating film by use of a material higher in dielectric constant than the first interlayer insulating film; a second interlayer insulating film formed on the insulating layer by use of a material lower in dielectric constant than the insulating layer; a contact plug which penetrates the second interlayer insulating film and the first interlayer insulating film and reaches the rear surface of the first interlayer insulating film; and a metal wiring layer which is formed on the insulating layer and which is in contact with the contact plug, wherein a partial region of the insulating layer is removed in a region around the contact plug, and a partial region in the bottom surface of the metal wiring layer is located lower than the upper surface of the contact plug and is in contact with the side surface of the contact plug.

BRIEF DESCRIPTION OF THE SEVERAL VIEWS OF THE DRAWING

FIG. 1 is a plan view showing an example of the configuration of a semiconductor device according to a first embodiment of the present invention;

FIGS. 2A to 2C are sectional views showing the example of the configuration of the semiconductor device according to the first embodiment of the present invention, wherein FIG. 2A is a sectional view along the IA-IA line in FIG. 1, FIG. 2B is a sectional view along the IB-IB line in FIG. 1, and FIG. 2C is a sectional view along the IC-IC line in FIG. 1;

FIGS. 3A to 3C are sectional views showing a first step of manufacturing the semiconductor device according to the first embodiment of the present invention, wherein FIG. 3A is a sectional view corresponding to FIG. 2A, FIG. 3B is a sectional view corresponding to FIG. 2B, and FIG. 3C is a sectional view corresponding to FIG. 2C;

FIGS. 4A to 4C are sectional views showing a second step of manufacturing the semiconductor device according to the first embodiment of the present invention, wherein FIG. 4A is a sectional view corresponding to FIG. 2A, FIG. 4B is a sectional view corresponding to FIG. 2B, and FIG. 4C is a sectional view corresponding to FIG. 2C;

FIGS. 5A to 5C are sectional views showing a third step of manufacturing the semiconductor device according to the first embodiment of the present invention, wherein FIG. 5A is a sectional view corresponding to FIG. 2A, FIG. 5B is a sectional view corresponding to FIG. 2B, and FIG. 5C is a sectional view corresponding to FIG. 2C;

FIGS. 6A to 6C are sectional views showing a fourth step of manufacturing the semiconductor device according to the first embodiment of the present invention, wherein FIG. 6A is a sectional view corresponding to FIG. 2A, FIG. 6B is a sectional view corresponding to FIG. 2B, and FIG. 6C is a sectional view corresponding to FIG. 2C;

FIGS. 7A to 7C are sectional views showing a fifth step of manufacturing the semiconductor device according to the first embodiment of the present invention, wherein FIG. 7A is a sectional view corresponding to FIG. 2A, FIG. 7B is a sectional view corresponding to FIG. 2B, and FIG. 7C is a sectional view corresponding to FIG. 2C;

FIGS. 8A to 8C are sectional views showing a sixth step of manufacturing the semiconductor device according to the first embodiment of the present invention, wherein FIG. 8A is a sectional view corresponding to FIG. 2A, FIG. 8B is a sectional view corresponding to FIG. 2B, and FIG. 8C is a sectional view corresponding to FIG. 2C;

FIGS. 9A to 9C are sectional views showing a seventh step of manufacturing the semiconductor device according to the first embodiment of the present invention, wherein FIG. 9A is a sectional view corresponding to FIG. 2A, FIG. 9B is a sectional view corresponding to FIG. 2B, and FIG. 9C is a sectional view corresponding to FIG. 2C;

FIGS. 10A to 10C are sectional views showing an eighth step of manufacturing the semiconductor device according to the first embodiment of the present invention, wherein FIG. 10A is a sectional view corresponding to FIG. 2A, FIG. 10B is a sectional view corresponding to FIG. 2B, and FIG. 10C is a sectional view corresponding to FIG. 2C;

FIG. 11 is an enlarged view of a metal wiring layer shown in FIG. 2A;

FIG. 12 is a sectional view of a semiconductor device according to a modification of the first embodiment of the present invention;

FIGS. 14A and 14B are sectional views showing the example of the configuration of the semiconductor device according to the second embodiment of the present invention, wherein FIG. 14A is a sectional view along the IIA-IIA line in FIG. 13, and FIG. 14B is a sectional view along the IIB-IIB line in FIG. 13;

FIGS. 15A and 15B are sectional views showing a first step of manufacturing the semiconductor device according to the second embodiment of the present invention, wherein FIG. 15A is a sectional view corresponding to FIG. 14A, and FIG. 15B is a sectional view corresponding to FIG. 14B;

FIGS. 16A and 16B are sectional views showing a second step of manufacturing the semiconductor device according to the second embodiment of the present invention, wherein FIG. 16A is a sectional view corresponding to FIG. 14A, and FIG. 16B is a sectional view corresponding to FIG. 14B;

FIGS. 17A and 17B are sectional views showing a third step of manufacturing the semiconductor device according to the second embodiment of the present invention, wherein FIG. 17A is a sectional view corresponding to FIG. 14A, and FIG. 17B is a sectional view corresponding to FIG. 14B;

FIGS. 18A and 18B are sectional views showing a fourth step of manufacturing the semiconductor device according to the second embodiment of the present invention, wherein FIG. 18A is a sectional view corresponding to FIG. 14A, and FIG. 18B is a sectional view corresponding to FIG. 14B;

FIGS. 19A and 19B are sectional views showing a fifth step of manufacturing the semiconductor device according to the second embodiment of the present invention, wherein FIG. 19A is a sectional view corresponding to FIG. 14A, and FIG. 19B is a sectional view corresponding to FIG. 14B;

FIGS. 20A and 20B are sectional views showing a sixth step of manufacturing the semiconductor device according to the second embodiment of the present invention, wherein FIG. 20A is a sectional view corresponding to FIG. 14A, and FIG. 20B is a sectional view corresponding to FIG. 14B;

FIGS. 21A and 21B are sectional views showing a seventh step of manufacturing the semiconductor device according to the second embodiment of the present invention, wherein FIG. 21A is a sectional view corresponding to FIG. 14A, and FIG. 21B is a sectional view corresponding to FIG. 14B;

FIG. 24 is a plan view showing the example of the configuration of the memory cell array provided in the NAND type flash memory according to the third embodiment of the present invention;

FIG. 27 is a plan view showing an example of the configuration of a memory cell array provided in a NAND type flash memory according to a second modification of the third embodiment of the present invention;

FIG. 28 is a plan view showing an example of the configuration of a memory cell array provided in a NAND type flash memory according to a third modification of the third embodiment of the present invention;

FIG. 32 is a plan view showing an example of the configuration of a memory cell array provided in a NAND type flash memory according to a second modification of the fourth embodiment of the present invention.

DETAILED DESCRIPTION OF THE INVENTION

Figure 6A:
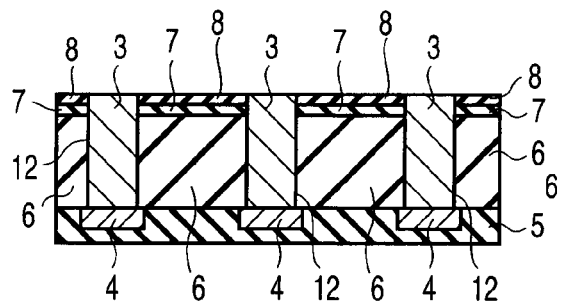

Embodiments of the present invention will be described with reference to the accompanying drawings. It should be noted that the drawings are schematic ones and the dimension ratios shown therein are different from the actual ones. The dimensions vary from drawing to drawing and so do the ratios of dimensions. The following embodiments are directed to a device and a method for embodying the technical concept of the present invention and the technical concept does not specify the material, shape, structure or configuration of components of the present invention. Various changes and modifications can be made to the technical concept without departing from the scope of the claimed invention.

First Embodiment

A semiconductor device according to a first embodiment of the present invention is described with FIG. 1. FIG. 1 is a plan view of the semiconductor device according to the present embodiment, and is a diagram particularly showing a metal wiring layer and a contact plug provided under the metal wiring layer.

As shown in FIG. 1, a semiconductor device 1 comprises a plurality of metal wiring layers 2. Although eight metal wiring layers are only shown in FIG. 1, the number is not limited. The metal wiring layers 2 form strips in a first direction, and are adjacent to one another in a second direction perpendicular to the first direction. Further, a contact plug 3 is formed under each of the metal wiring layers 2. The contact plug 3 is connected to a lower metal wiring layer 4. The contact plugs 3 adjacent to each other in the second direction are arranged at positions different in the first direction. In other words, the contact plugs 3 are arranged in a zigzag form in the second direction.

Next, the sectional structure of the semiconductor device 1 having such a configuration is described with FIGS. 2A to 2C. FIGS. 2A to 2C are sectional views along the IA-IA line, the IB-IB line and the IC-IC line in FIG. 1, respectively.

As shown, the metal wiring layer 4 is formed in the surface of an interlayer insulating film 5. An interlayer insulating film 6 is further formed on the interlayer insulating film 5. An insulating film 7 is formed on the inter-layer insulating film 6. The insulating film 7 is formed using a material higher in dielectric constant than a material used for the interlayer insulating films 5, 6. An interlayer insulating film 8 is further formed on the insulating film 7. The interlayer insulating film 8 is formed using a material lower in dielectric constant than the material used for the insulating film 7. Then, the contact plug 3 is formed so that it may penetrate the interlayer insulating film 8, the insulating film 7 and the interlayer insulating film 6 from the surface of the interlayer insulating film 8 and the bottom of the contact plug 3 may reach the metal wiring layer 4. An interlayer insulating film 9 is further formed on the interlayer insulating film 8. The metal wiring layer 2 is formed in the interlayer insulating films 8, 9. The metal wiring layer 2 is formed so that it may penetrate the interlayer insulating film 9 from the surface of the interlayer insulating film 9 to reach the upper surface of the contact plug 3 and may also penetrate the interlayer insulating films 9, 8 to reach the surface of the insulating film 7. That is, the bottom of the metal wiring layer 2 is in contact with the upper surface of the contact plug 3 in a region where the contact plug 3 is located, and in contact with the surface of the insulating film 7 deeper than the upper surface of the contact plug 3 in a region where the contact plug 3 is not located. An interlayer insulating film 10 is further formed on the interlayer insulating film 9, and a metal wiring layer 11 is disposed within the interlayer insulating film 10. The metal wiring layer 11 is in contact with any of the metal wiring layers 2.

Next, a method of manufacturing the semiconductor device 1 having such a configuration is described with FIGS. 3A to 3C through FIGS. 10A to 10C. FIGS. 3A to 3C through FIGS. 10A to 10C are sectional views sequentially showing steps of manufacturing the semiconductor device 1 according to the present embodiment. FIG. 3A to FIG. 10A are sectional views along the IA-IA line in FIG. 1, FIG. 3B to FIG. 10B are sectional views along the IB-IB line in FIG. 1, and FIG. 3C to FIG. 10C are sectional views along the IC-IC line in FIG. 1.

First, as shown in FIGS. 3A to 3C, a plurality of metal wiring layers 4 are formed in a surface region of the interlayer insulating film 5. The interlayer insulating film 5 covers an unshown semiconductor element, and is formed by using, for example, $SiO_2$ as its material. Then, the interlayer insulating film 6 (hereinafter sometimes referred to as an $SiO_2$ film 6) is formed on the interlayer insulating film 5 by using, for example, $SiO_2$ as its material. Further, the insulating film 7 (hereinafter sometimes referred to as an SiN film 7) is formed on the interlayer insulating film 6 by using a material higher in dielectric constant than the interlayer insulating film 6, for example, SiN as its material. In addition, as the material of the insulating film 7, SiCN or a stack film of SiN and SiCN may be used instead of SiN.

Then, as shown in FIGS. 4A to 4C, the interlayer insulating film 8 (hereinafter sometimes referred to as an $SiO_2$ film 8) is formed on the insulating film 7 by using, for example, $SiO_2$ as its material.

Then, as shown in FIGS. 5A to 5C, the interlayer insulating film 6, the insulating film 7 and the interlayer insulating film 8 are etched by a photolithographic technique and anisotropic dry etching. A contact hole 12 reaching the metal wiring layer 4 is formed by this etching. Then, a conducting layer 13 is formed in the contact hole 12 and on the interlayer insulating film 8, so that the conducting layer 13 is embedded in the contact hole 12.

Figure 6B:
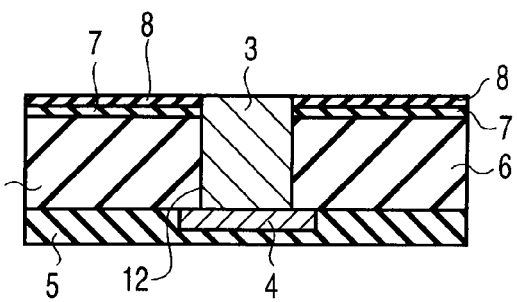
Figure 6C:
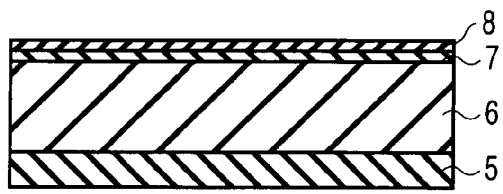

Then, as shown in FIGS. 6A to 6C, the conducting layer 13 is polished by, for example, a chemical mechanical polishing (CMP) method so that it may only remain in the contact hole 12. Thus, the contact plug 3 as shown is formed. The bottom of the contact plug 3 is in contact with the metal wiring layer 4.

Figure 7A:
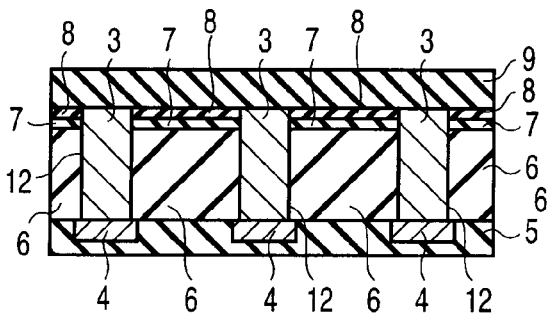
Figure 7B:
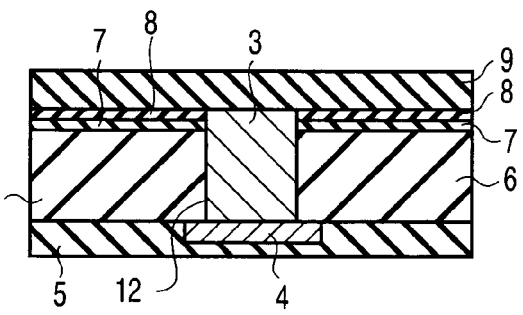
Figure 7C:
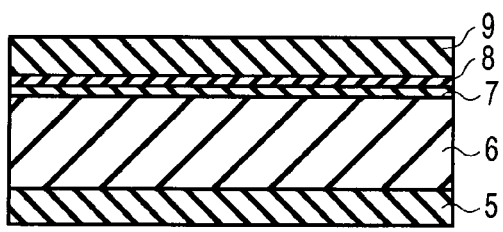

Then, as shown in FIGS. 7A to 7C, the interlayer insulating film 9 (hereinafter sometimes referred to as an $SiO_2$ film 9) is formed on the interlayer insulating film 8 by using, for example, $SiO_2$ as its material. The interlayer insulating film 9 covers the upper surface of the contact plug 3.

Figure 8A:
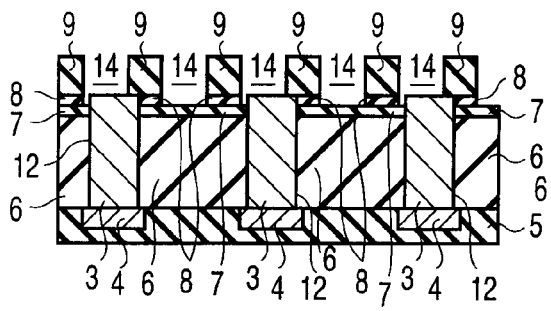
Figure 8B:
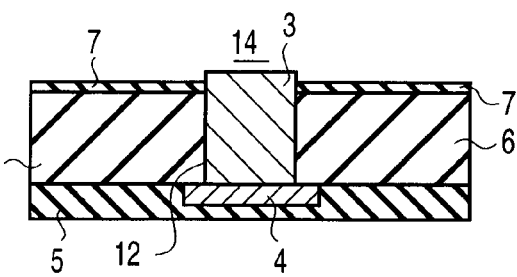
Figure 8C:
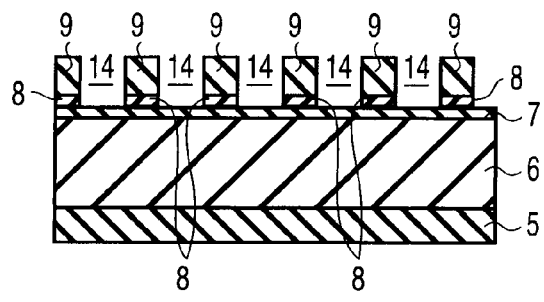

Then, as shown in FIGS. 8A to 8C, the interlayer insulating film 8 and the interlayer insulating film 9 are etched by use of the photolithographic technique and dry etching (e.g., reactive ion etching (RIE)), so that a groove 14 is formed. At this point, the insulating film 7 functions as an etching stopper of the RIE. As a result, the insulating film 7 and the contact plug 3 are exposed in the bottom surface of the groove 14. Therefore, the material of the insulating film 7 is not limited to SiN, and may be any material as long as it allows for etching selectivity for the interlayer insulating film 8 and the interlayer insulating film 9 in the present etching step. One example is SiCN or a stack film of SiN and SiCN. In other words, the RIE is carried out under an etching condition which allows for sufficient etching selectivity between the interlayer insulating films ($SiO_2$) 8, 9 and the insulating film (SiN, SiCN) 7.

In addition, FIGS. 8A to 8C show a case where a lithographic misalignment has taken place. Thus, as shown in FIG. 8A, not only the upper surface of the contact plug 3 but also the side surface of upper part of the contact plug 3 and the surface of the insulating film 7 are exposed in the bottom of the groove 14.

Figure 9A:
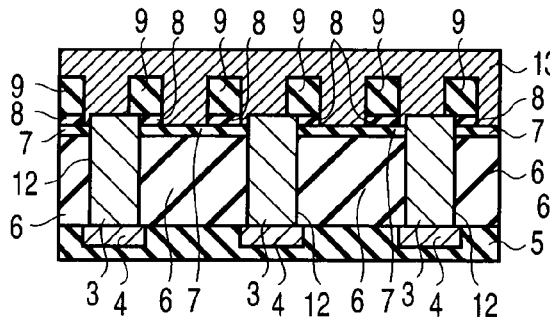
Figure 9B:
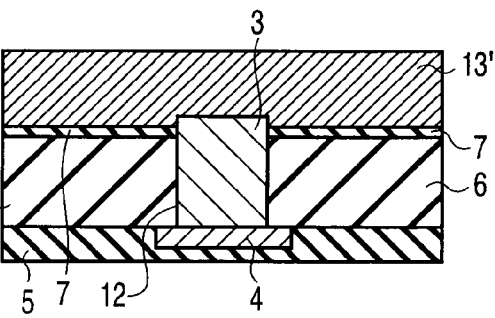
Figure 9C:
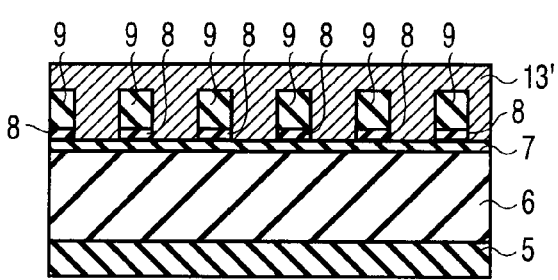

Then, as shown in FIGS. 9A to 9C, the conducting layer 13' is formed within the groove 14 and on the interlayer insulating film 9, so that the conducting layer 13' is embedded in the groove 14.

Furthermore, as shown in FIGS. 10A to 10C, the conducting layer 13' is polished by, for example, the CMP method using the interlayer insulating film 9 as a stopper. As a result, the metal wiring layer 2 in which the conducting layers are embedded in the grooves 14 is completed.

Subsequently, the interlayer insulating film 10 is formed on the interlayer insulating film 9 by using, for example, $SiO_2$ as its material. Then, dry etching or wet etching is used to penetrate part of the interlayer insulating film 10, thereby forming a groove reaching any of the metal wiring layers 2. Further, a metal or the like is embedded in this groove to form the metal wiring layer 11 connected to the metal wiring layers 2. Thus, the configuration in FIG. 1 and FIGS. 2A to 2C is completed.

According to the semiconductor device and its manufacturing method described above, the following effects (1), (2) can be obtained:

(1) The manufacturing accuracy of the metal wiring layer can be improved.

In the configuration according to the present embodiment, the SiN film 7 as the etching stopper is provided on the interlayer insulating film 6. Therefore, the etching of the interlayer insulating film 8 and the interlayer insulating film 9 is once stopped on the SiN film 7 when the grooves 14 for the formation of the metal wiring layers 2 are formed (see FIGS. 8A to 8C). As a result, the depths of the grooves 14 in which the metal wiring layers 2 are to be embedded are substantially uniform. In other words, the etching of the interlayer insulating film 8 and the interlayer insulating film 9 during the formation of the grooves 14 has only to be carried out until the SiN film 7 is reached, so that the terminal position of the etching of the interlayer insulating film 8 and the interlayer insulating film 9 is well-defined. Therefore, the depths of the grooves 14 can be easily controlled.

Furthermore, as has been described with FIGS. 9A to 9C and FIGS. 10A to 10C, the metal wiring layer 2 is formed by polishing the conducting layer 13' in accordance with the CMP method. In this case, the interlayer insulating film 9 functions as a stopper of the CMP. This allows the upper surfaces of the metal wiring layers 2, 2 to be uniform.

As a result, in case of a lithographic misalignment shown FIGS. 8A to 8C, the positions of the upper surfaces and lower surfaces of the metal wiring layers 2 are substantially uniform. That is, the depths of the metal wiring layers 2 from the surface of the interlayer insulating film 9 can be easily made uniform. Therefore, as shown in FIG. 11, the heights h1, h2 of the adjacent metal wiring layers 2 can be uniform. Even if the lithographic misalignment has not taken, the heights h1, h2 of the adjacent metal wiring layers 2 can be uniform, in case that diameter of the contact plug 3 is narrower than width of the metal wiring layers 2. In addition, FIG. 11 is an enlarged view of FIG. 2A, and particularly focuses on and shows the metal wiring layer 2. As shown, the bottom surfaces of the plurality of metal wiring layers 2 are flush (upper surface of the SiN film 7), and their upper surfaces are also flush (upper surface of the interlayer insulating film 9). Thus, the height h1 of a certain metal wiring layer 2 is equal to the height h2 of a metal wiring layer 2 adjacent thereto.

Furthermore, the uniformed heights of the metal wiring layers 2 lead to improved performance of the semiconductor device 1. Variations in the heights of the metal wiring layers 2 are equal to variations in the opposite areas of parasitic capacitors of the adjacent metal wiring layers 2, 2. Moreover, variations in the opposite areas cause variations in the capacities of the parasitic capacitors, such that the characteristics of the semiconductor device deteriorate. However, in the configuration according to the present embodiment, the heights of the metal wiring layers 2 can be substantially equal, so that it is possible to inhibit any variations in wiring capacitance and improve the characteristics of the semiconductor device 1.

(2) The inter-wiring capacitance of the semiconductor device can be reduced.

In the configuration according to the present embodiment, the upper surface of the SiN film 7 higher in dielectric constant than the $SiO_2$ film is at the same position as the bottom surface of the metal wiring layer 2, as shown in FIG. 2A. Moreover, an $SiO_2$ film lower in dielectric constant than SiN is present between the metal wiring layers 2, 2. As a result, inter-wiring capacitance between the metal wiring layers 2, 2 is reduced as compared with the case where SiN is present between the adjacent metal wiring layers 2, 2. Consequently, the reduction of the inter-wiring capacitance makes it possible to suppress a signal delay in the metal wiring layer 2.

In addition, part of the bottom surface of the metal wiring layer 2 is in contact with the insulating film 7 in the case of the embodiment described above. However, it may be out of contact with the insulating film 7. This case is described with FIG. 12. FIG. 12 is a sectional view of a semiconductor device according to a modification of the embodiment described above, and is a diagram particularly focusing on the metal wiring layers 2. As shown, the bottom surface of the metal wiring layer 2 in a region out of contact with the contact plug 3 may be located within the interlayer insulating film 8 without being in contact with the insulating film 7. Also by this composition, (1), (2) effect can be obtained.

Second Embodiment

Figure 13:
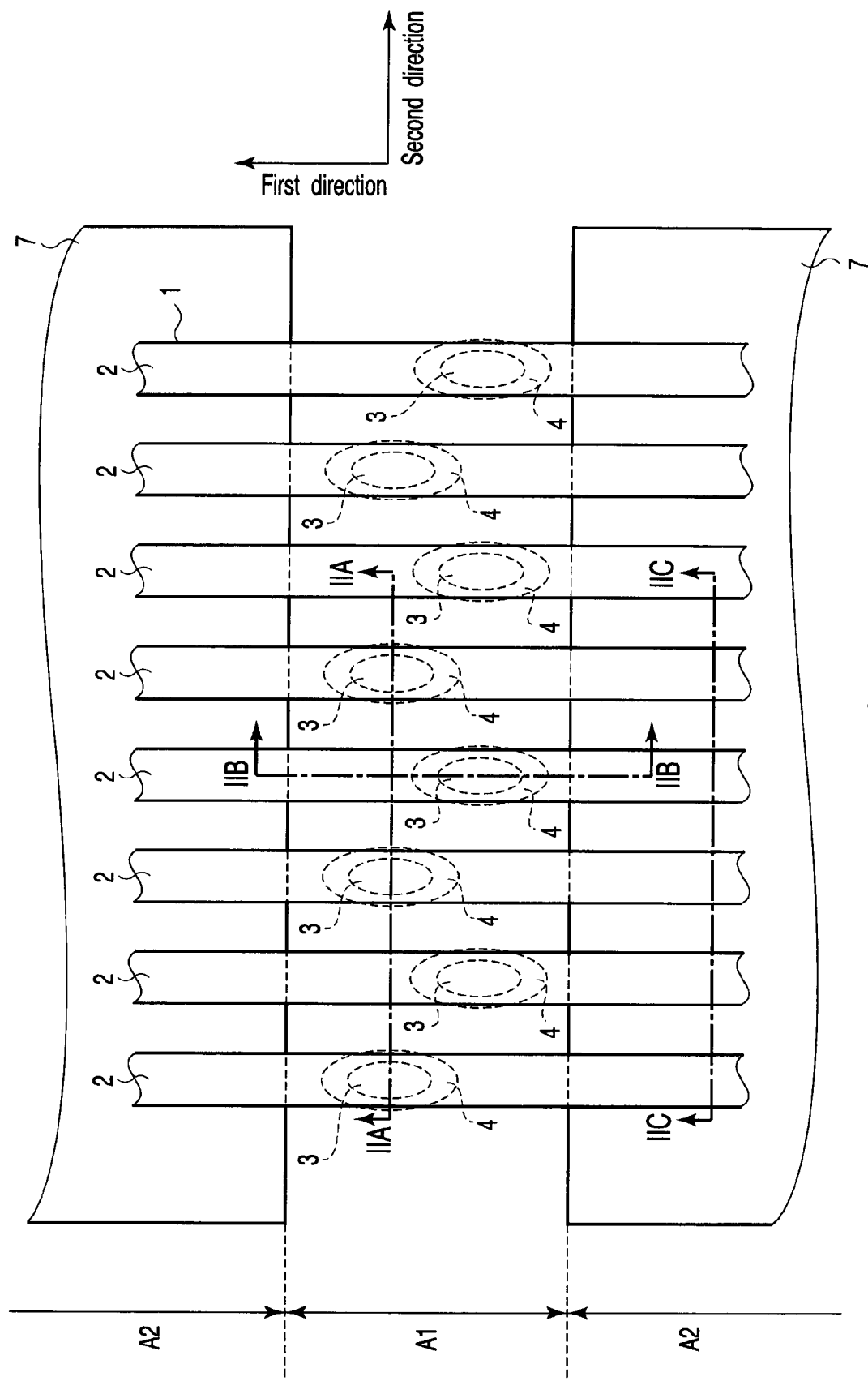
FIG. 13 is a plan view showing an example of the configuration of a semiconductor device according to a second embodiment of the present invention.

Next, a semiconductor device according to a second embodiment of the present invention will be described. In the present embodiment, the insulating film 7 in a region around the contact plug 3 has been removed from the first embodiment described above. FIG. 13 is a plan view of the semiconductor device according to the present embodiment. It is to be noted that the insulating film 7 is also shown in FIG. 13.

As shown, a semiconductor device 1 according to the present embodiment comprises a metal wiring layer 2, a contact plug 3 provided under the metal wiring layer 2, a metal wiring layer 4 and an insulating film 7, as in the configuration in FIG. 1 described in the first embodiment. Hereinafter, a region where the contact plugs 3 are provided will be called a region A1, and other regions will be called regions A2. As shown, in the configuration according to the present embodiment, the insulating film 7 in the region A1 around the contact plugs 3 has been removed. That is, the strip of insulating film 7 has been removed in a second direction. In the regions A2, the insulating film 7 is present as in the first embodiment.

Next, the sectional structure of the semiconductor device 1 having such a configuration is described with FIGS. 14A and 14B. FIGS. 14A and 14B are sectional views along the IIA-IIA line and the IIB-IIB line in FIG. 13, respectively. Moreover, a section along the IIC-IIC line in FIG. 13 in the present embodiment is the same as that in FIG. 2C described in the first embodiment and is therefore omitted.

As shown in FIGS. 14A and 14B, the insulating film 7 in the region A1 around the contact plugs 3 in the configuration according to the first embodiment has been removed in the configuration according to the present embodiment. Thus, an interlayer insulating film 8 is formed directly on an interlayer insulating film 6 in this region A1. The contact plug 3 penetrates the interlayer insulating films 8, 6 from the surface of the interlayer insulating film 8, and the bottom of contact plug 3 reaches the metal wiring layer 4. The metal wiring layer 2 is formed in the interlayer insulating film 9. The metal wiring layer 2 penetrates the interlayer insulating film 9 from the surface of the interlayer insulating film 9, and the bottom of the metal wiring layer 2 is located in the interlayer insulating film 8 in the region A1 and is partly in contact with the contact plug 3. Moreover, the bottom of the metal wiring layer 2 is in contact with the upper surface of the insulating film 7 in the regions A2.

Therefore, the bottom surface of the metal wiring layer 2 in the region A1 is located deeper than the bottom surface of the metal wiring layer 2 in the regions A2. Thus, the height h3 of the metal wiring layer 2 in the region A1 is greater than the height h4 of the metal wiring layer 2 in the regions A2 (see FIG. 14B).

An interlayer insulating film 10 is further formed on the metal wiring layer 2 and the interlayer insulating film 9, and a metal wiring layer 11 is disposed within the interlayer insulating film 10. The metal wiring layer 11 is in contact with any of the metal wiring layers 2.

Next, a method of manufacturing the semiconductor device 1 having such a configuration is described with FIGS. 15A and 15B through FIGS. 21A and 21B. FIGS. 15A and 15B to FIGS. 21A and 21B are sectional views sequentially showing steps of manufacturing the semiconductor device 1 according to the present embodiment. FIG. 15A to FIG. 21A are sectional views along the IIA-IIA line in FIG. 13, and FIG. 15B to FIG. 21B are sectional views along the IIB-IIB line in FIG. 13. Moreover, a section along the IIC-IIC line in FIG. 13 in the present manufacturing process is the same as that in FIG. 3C to FIG. 10C described in the first embodiment and is therefore omitted.

First, the structure in FIGS. 3A to 3C is obtained by the process described in the first embodiment. Then, as shown in FIGS. 15A and 15B, the insulating film 7 in the region A1 is removed. At this point, the insulating film 7 remains in the regions A2.

Then, as shown in FIGS. 16A and 16B, the interlayer insulating film 8 is formed on the interlayer insulating film 6 and the insulating film 7. Since the film thickness of the interlayer insulating film 8 is fixed. As for a thickness of the interlayer insulating film 8 in the regions A2 are higher than in the regions A1. Further, in the region A1, a contact hole 12 reaching the metal wiring layer 4 is formed in the interlayer insulating films 8, 6 by use of the photolithographic technique and dry etching. Then, a conducting layer 13 is formed within the contact hole 12 and on the interlayer insulating film 8, and the conducting layer 13 is embedded in the contact hole 12.

Then, as shown in FIGS. 17A and 17B, the conducting layer 13 is polished by, for example, the chemical mechanical polishing (CMP) method and only remains in the contact hole 12. Simultaneously, the upper surface of the interlayer insulating film 8 is the same in the regions A1 and the regions A2 by over etching. Consequently, as for the thickness of the interlayer insulation film 8 in the regions A1 are thicker than in the regions A2. Thus, the contact plug 3 as shown is completed. The bottom of the contact plug 3 is in contact with the metal wiring layer 4.

Then, as shown in FIGS. 18A and 18B, the interlayer insulating film 9 covering the upper surface of the contact plug 3 is formed on the interlayer insulating film 8.

Then, as shown in FIGS. 19A and 19B, the interlayer insulating film 8 and the interlayer insulating film 9 are etched by use of the photolithographic technique and dry etching (e.g., RIE), so that a groove 14 is formed. At this point, the insulating film 7 functions as an etching stopper of the RIE. As in the first embodiment, the material of the insulating film 7 is not limited to SiN, and may be any material as long as it allows for etching selectivity for the interlayer insulating film 8 and the interlayer insulating film 9 in the present etching step. One example is SiCN or a stack film of SiN and SiCN. In the present etching step, the etching stops in the insulating film 7 in the regions A2. However, part of the surface of the interlayer insulating film 8 is also etched in the region A1 where the insulating film 7 is not present. Then, an upper surface of the interlayer insulating film 8 is lower than an upper surface of the insulating film 7. Therefore, the groove 14 is deeper in the region A1 than in the regions A2. In addition, since the interlayer insulating film 8 in the regions A1 are thicker than in the regions A2, not all the interlayer insulating film 8 in the regions A1 is etched.

In addition, as in the first embodiment, FIGS. 19A and 19B show a case where a lithographic misalignment has taken place. Thus, as shown in FIG. 19A, not only the upper surface of the contact plug 3 but also the side surface of the contact plug 3 and the upper surface of the interlayer insulating film 8 are exposed in the bottom of the groove 14.

Figure 20A:
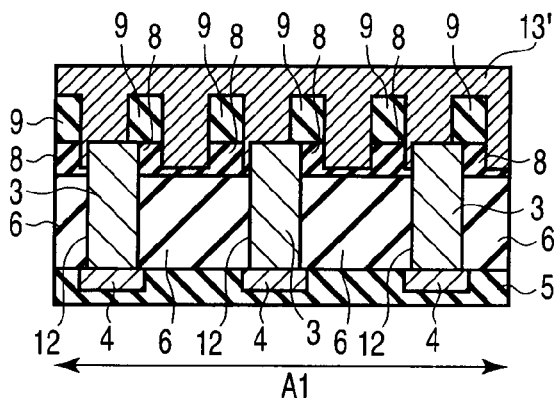
Figure 20B:
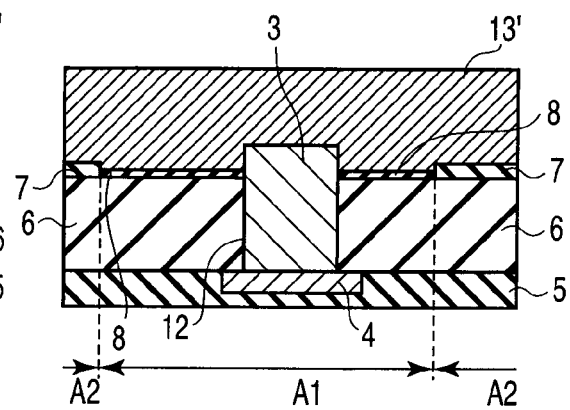

The following steps are similar to those in FIGS. 9A to 9C through FIGS. 10A to 10C described in the first embodiment. That is, as shown in FIGS. 20A and 20B, the conducting layer 13' is formed within the groove 14 and on the interlayer insulating film 9, and the conducting layer 13' is embedded in the groove 14.

Figure 21A:
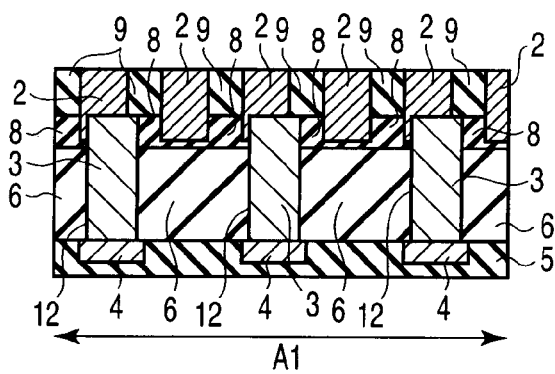
Figure 21B:
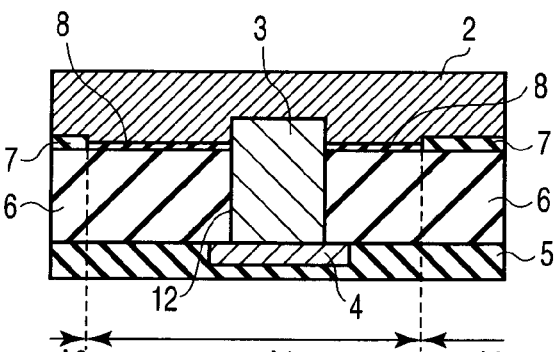

Then, as shown in FIGS. 21A and 21B, the conducting layer 13' is polished by, for example, the CMP method using the interlayer insulating film 9 as a stopper. As a result, the metal wiring layer 2 in which the conducting layers are embedded in the grooves 14 is completed.

Subsequently, the interlayer insulating film 10 is formed on the interlayer insulating film 9. Then, dry etching or wet etching is used to form a groove penetrating part of the interlayer insulating film 10, and a metal or the like is embedded in this groove to form the metal wiring layer 11. Consequently, the configuration in FIG. 13 and FIGS. 14A and 14B is completed.

According to the semiconductor device and its manufacturing method described above, the following effects (3), (4) can be obtained in addition to the effects (1), (2) described in the first embodiment:

(3) The power consumption of the semiconductor device can be reduced.

In the configuration according to the present embodiment, the SiN film 7 under the metal wiring layer 2 has been removed in the region A1 where the contact plugs 3 are formed, as shown in FIG. 14B. Thus, the $SiO_2$ film 8 lower in electric conductivity than the SiN film 7 is formed around the contact plug 3 (see FIGS. 14A and 14B).

If the SiN film 7 is present between adjacent contact plugs 3, 3, a slight current runs across the contact plugs 3, 3 via this SiN film 7. Moreover, when there are an extremely large number of contact plugs 3, the total of currents running across the contact plugs 3, 3 amounts to a great value which is not negligible in the semiconductor device. That is, the power consumption of the semiconductor device may increase in vain.

In this respect, in the configuration according to the present embodiment, the SiN film 7 is not present between the contact plugs 3, 3, but the $SiO_2$ film 8 is present. Therefore, even when there are a large number of contact plugs 3, it is possible to slightly reduce the current running across the contact plugs 3, 3 via the $SiO_2$ film 8, such that the power consumption of the semiconductor device can be reduced.

(4) The effects (1), (2) can be obtained without increasing the manufacturing steps of the semiconductor device.

In a semiconductor process, etching conditions for $SiO_2$ are generally different from etching conditions for SiN. In that case, the step of forming the contact hole 12 described with FIGS. 5A to 5C described in the first embodiment is as follows: First, the $SiO_2$ film 8 is etched under the etching conditions for $SiO_2$. Then, the etching conditions are changed to be suitable for SiN, and the SiN film 7 is etched. Then, the etching conditions are again changed to be suitable for $SiO_2$, and the $SiO_2$ film 6 is etched.

In this respect, in the configuration according to the present embodiment, the SiN film 7 is not present in the region A1 where the contact hole 12 is to be formed. Therefore, the contact hole 12 described with FIG. 16 can be formed in one etching step under the etching conditions suitable for $SiO_2$. That is, there is no need to change the etching conditions a plurality of times to form the contact hole 12. Thus, the manufacturing process of the semiconductor device can be simplified.

In addition, in the manufacturing method according to the present embodiment as well, the insulating film 7 in the regions A2 functions as a stopper during the etching of the interlayer insulating films 8, 9. Therefore, the depths of the grooves 14 in the regions A2 are uniform. This is as shown in FIG. 11 described in the first embodiment. The depths of the grooves 14 in the region A1 are also substantially uniform.

Figure 22:
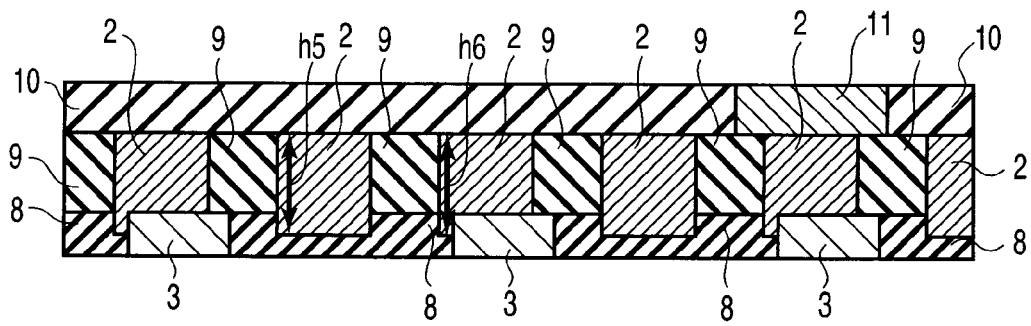
FIG. 22 is an enlarged view of a metal wiring layer shown in FIG. 14A.

FIG. 22 is an enlarged view of FIG. 14A, and particularly focuses on and shows the metal wiring layer 2. In addition, FIG. 22 shows a case where a lithographic misalignment has taken in the step of FIGS. 19A and 19B. As shown, the etching of the interlayer insulating film 8 is stopped in the step of FIGS. 19A and 19B, such that the heights h5, h6 of the adjacent the metal wiring layers 2 are substantially uniform even in the region A1 where there is no etching stopper. Thus, variations in parasitic capacitance are inhibited, and the effect (1) described in the first embodiment can be obtained.

Furthermore, the contact plugs 3 are arranged in a zigzag form in the second direction in the cases described in the first and second embodiments. However, the contact plugs 3 may be aligned in the second direction. That is, the centers of the contact plugs 3 may be arranged to be located on a straight line in the second direction. However, from the perspective of operation reliability, it is preferable to arrange the contact plugs 3 in a zigzag form. The reason for this is that the space between the adjacent contact plugs 3 can be larger than when the contact plugs 3 are aligned, which can effectively prevent a short circuit between the contact plugs 3, 3.

Third Embodiment

Figure 23:
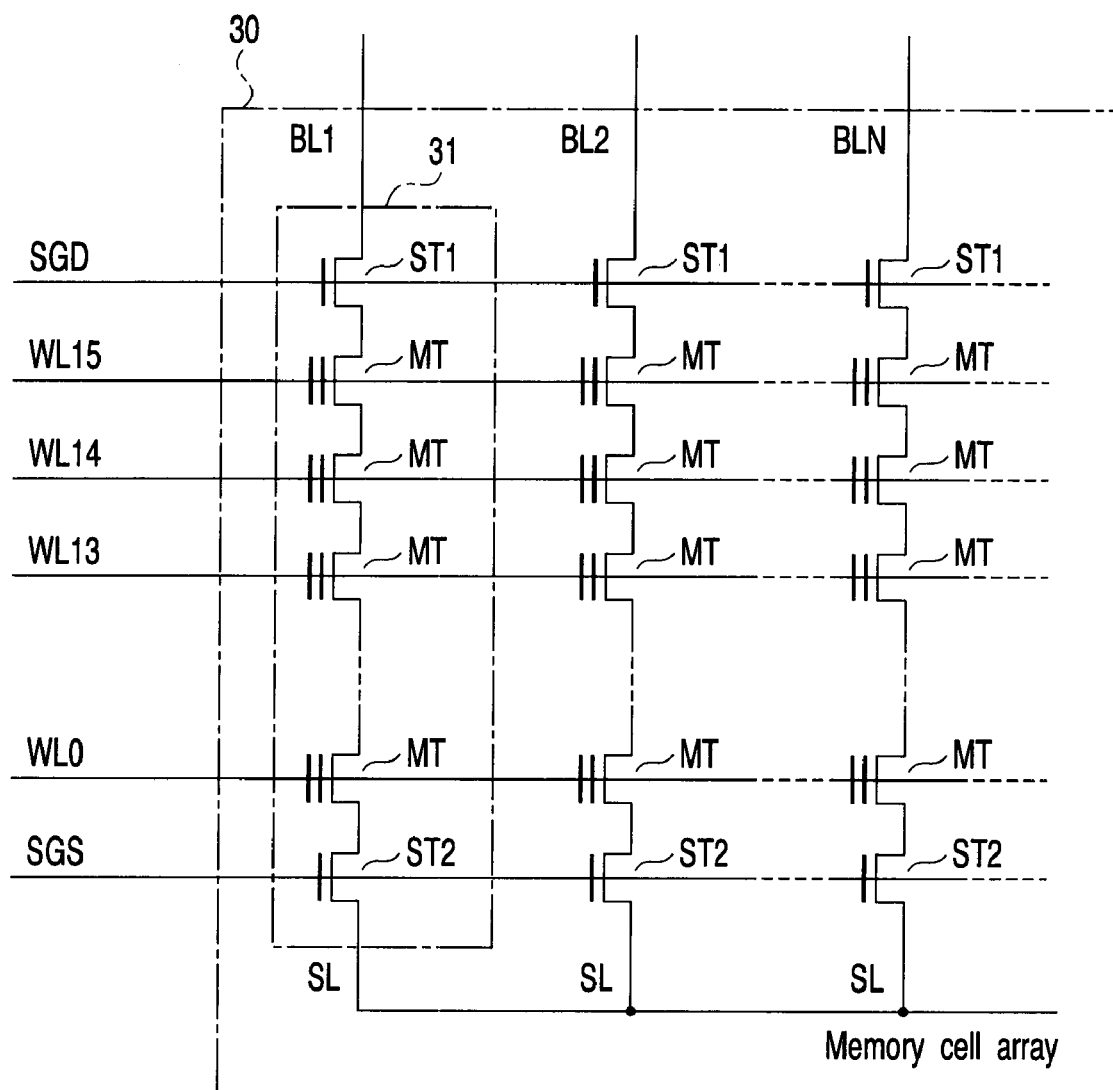
FIG. 23 is a circuit diagram showing an example of the configuration of a memory cell array provided in a NAND type flash memory according to a third embodiment of the present invention.

Next, a semiconductor storage device according to a third embodiment of the present invention will be described. In the present embodiment, the configuration described in the first embodiment is applied to a NAND type flash memory. FIG. 23 is a circuit diagram of a memory cell array provided in the NAND type flash memory according to the present embodiment.

As shown, a memory cell array 30 comprises a plurality of NAND cells 31 in which nonvolatile memory cells are connected in series. Each of the NAND cells 31 includes, for example, sixteen memory cell transistors MT, and selective transistors ST1, ST2. The memory cell transistor MT comprises a stacked gate structure having a charge storage layer (e.g., a floating gate electrode FG) formed on a semiconductor substrate with a gate insulating film in between, and a control gate electrode (CG) formed on the floating gate electrode with an inter-gate insulating film in between. In addition, the number of memory cell transistors MT is not limited to 16, and may be, but is not limited to, 8 or 32, 64, 128, 256, etc. The memory cell transistors MT adjacent to each other share a source (S) region and a drain (D) region. Moreover, the sixteen memory cell transistors MT are arranged between the selective transistors ST1, ST2 so that electric paths are connected in series. The drain region on one end of the memory cell transistors MT connected in series is connected to the source region of the selective transistor ST1, and the source region on the other end is connected to the drain region of the selective transistor ST2.

The control gate electrodes of the memory cell transistors MT on the same row are connected to any common one of word lines WL0 to WL15. The gate electrodes of the selective transistors ST1, ST2 on the same row are connected to common select gate lines SGD, SGS. In addition, for simplification of explanation, the word lines WL0 to WL15 may sometimes be simply referred to as word lines WL below. Further, the drain regions of the selective transistors ST1 in the same column in the memory cell array 30 are connected to any one of bit lines BL0 to BLN(N is a natural number). In addition, the bit lines BL0 to BLN may sometimes be simply referred to as bit lines BL below. The source regions of the selective transistors ST2 are connected to a common source line SL. In addition, both of the selective transistors ST1, ST2 are not always needed, and solely one of them may be provided as long as the NAND cells 31 can be selected.

In FIG. 23, the NAND cells 31 for one row are only shown. However, a plurality of rows of NAND cells 31 may be provided in the memory cell array 30. In this case, the NAND cells 31 in the same column are connected to the same common bit line BL. Further, data is collectively written into a plurality of memory cell transistors MT connected to the same word line WL, and this unit is referred to as a page. Moreover, data is collectively erased in a plurality of NAND cells 31 in the same row, and this unit is referred to as a block.

Next, the planar structure of the memory cell array 30 having such a configuration is descried with FIG. 24. FIG. 24 is a plan view of the memory cell array 30. As shown, a plurality of strips of element regions AA in a first direction are provided in a semiconductor substrate 40 in a second direction perpendicular to the first direction. An element separation region ST1 is formed between adjacent element regions AA, AA, and the element regions AA are electrically separated by this element separation region ST1. On the semiconductor substrate 40, the strips of word lines WL and select gate lines SGD, SGS in the second direction are formed across a plurality of element regions AA. The floating gate electrode FG is provided in a region where the word line WL intersects with the element region AA. Moreover, the memory cell transistor MT is provided in a region where the word line WL intersects with the element region AA, and the selective transistors ST1, ST2 are provided in regions where the select gate lines SGD, SGS intersect with the element region AA. Impurity diffused layers serving as the source regions or drain regions of the memory cell transistors MT and the selective transistors ST1, ST2 are formed in the element regions AA between the word lines WL, WL adjacent in the first direction, between the select gate lines and between the word line and the select gate line.

The impurity diffused layer formed in the element region AA between the select gate lines SGS, SGS adjacent in the first direction functions as the source region for the selective transistor ST2. Then, a contact plug CP1 is formed on this source region. The contact plug CP1 is connected to an unshown source line. The impurity diffused layer formed in the element region AA between the select gate lines SGD, SGD adjacent in the first direction also functions as the drain region for the selective transistor ST1. Then, a contact plug CP2 (not shown) is formed on this drain region. A metal wiring layer 50 is formed on each of the contact plugs CP2, and a contact plug CP3 is further formed on the metal wiring layer 50. Then, the contact plugs CP3 are connected to the strips of bit lines BL provided along the first direction.

The sections of the contact plugs CP1 to CP3 and the metal wiring layer 50 in a planar direction have an elliptic shape whose major axis extends in a first direction and whose minor axis extends in a second direction. Moreover, the contact plugs CP2, CP3 and the metal wiring layers 50 are arranged in a zigzag form in the second direction.

Figure 25:
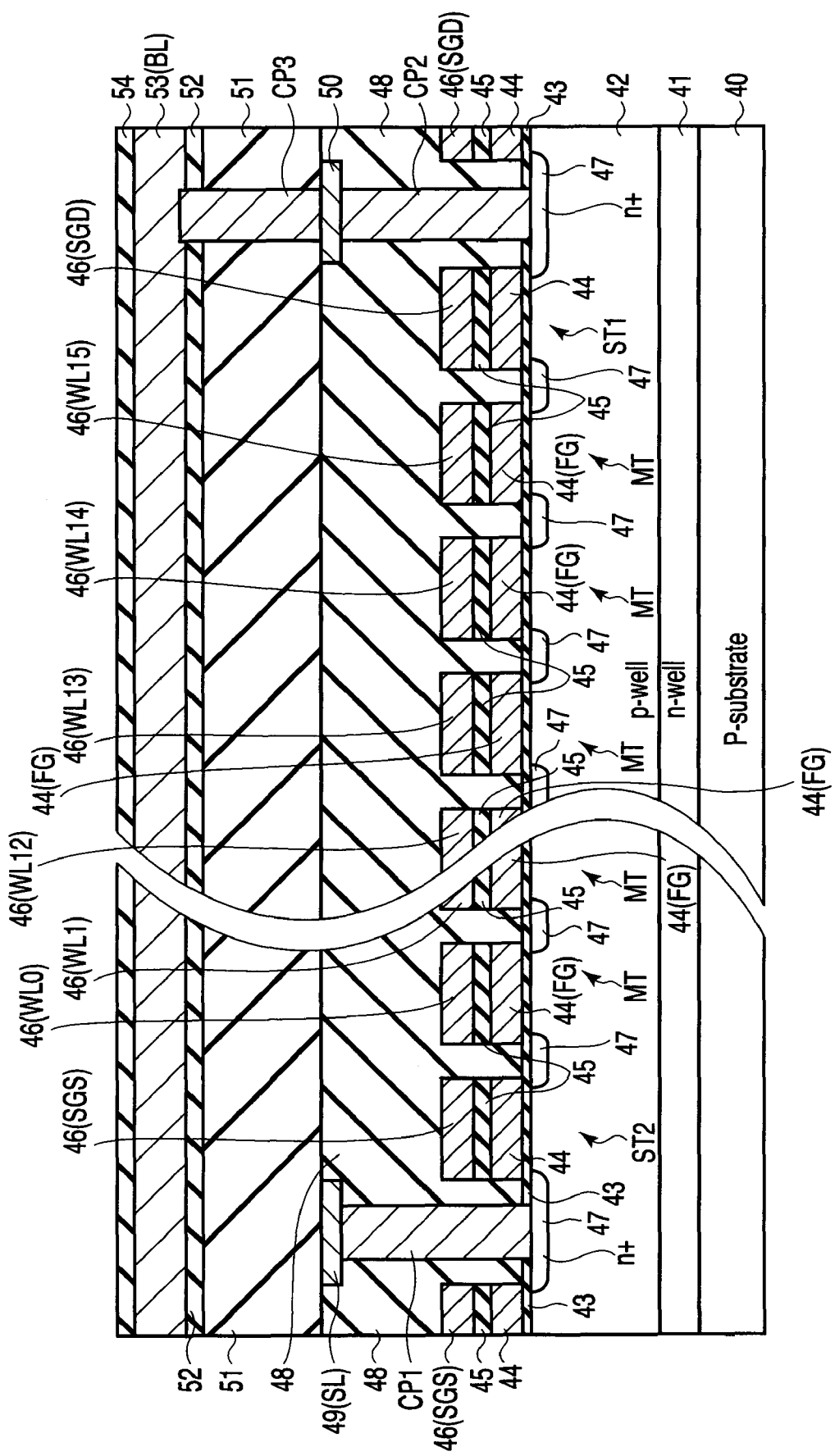
FIG. 25 is a sectional view showing the example of the configuration of the memory cell array provided in the NAND type flash memory according to the third embodiment of the present invention, and is a sectional view along the IIIB-IIIB line in FIG. 24.

Next, the sectional structure of the semiconductor device having such a configuration is described with FIG. 25. FIG. 25 is a sectional view of the NAND cell, and is a sectional view in a bit line direction (the first direction/the IIIB-IIIB line).

As shown, an n-type well region 41 is formed in a surface region of the P-type semiconductor substrate 40. A p-type well region 42 is formed on the n-type well region 41. A gate insulating film 43 is formed on the p-type well region 42, and the gate electrodes of the memory cell transistors MT and the selective transistors ST1, ST2 are formed on the gate insulating film 43. The gate electrode of the memory cell transistors MT and the selective transistors ST1, ST2 has a polycrystalline silicon layer 44 formed on the gate insulating film 43, an inter-gate insulating film 45 formed on the polycrystalline silicon layer 44, and a polycrystalline silicon layer 46 formed on the inter-gate insulating film 45.

The inter-gate insulating film 45 is formed by, for example, a silicon oxide film (O film), or an ON film or NO film, which is a stacked structure of a silicon oxide film and a silicon nitride film (N film), or an ONO film, or a stacked structure including the above, or a stacked structure of a $TiO_2$ film, an $HfO_2$ film, an $Al_2O_3$ film, an $HfAlO_x$ film, an HfAlSi film, and a silicon oxide film or silicon nitride film. Moreover, the gate insulating film 43 of the memory cell transistor MT functions as a tunnel insulating film.

In the memory cell transistor MT, the polycrystalline silicon layer 44 functions as the floating gate electrode FG. On the other hand, the polycrystalline silicon layers 46 adjacent in a direction perpendicular to the bit line are connected to each other, and function as control gate electrodes (word lines WL). In the selective transistors ST1, ST2, the polycrystalline silicon layers 46 adjacent in the word line direction are connected to each other. Then, the polycrystalline silicon layers 46 function as the select gate lines SGS, SGD.

In addition, the polycrystalline silicon layers 44 alone may function as the select gate lines SGS, SGD. In this case, the potentials of the polycrystalline silicon layers 46 of the selective transistors ST1, ST2 are constant or floating.

An $N^+$-type impurity diffused layer 47 is formed in the surface of the semiconductor substrate 40 located between the gate electrodes. The impurity diffused layer 47 is shared by adjacent transistors, and functions as a source region or drain region. Moreover, a region between the source region and the drain region adjacent to each other functions as a channel region which serves as a region for the movement of electrons. The gate electrodes, the impurity diffused layers 47 and the channel regions constitute MOS transistors which serve as the memory cell transistors MT and the selective transistors ST1, ST2.

On the semiconductor substrate 40, an interlayer insulating film 48 is formed to cover the memory cell transistors MT and the selective transistors ST1, ST2. In the interlayer insulating film 48, the contact plug CP1 is formed which reaches the impurity diffused layer (source region) 47 of the selective transistor ST2 on the side of the source region. Then, a metal wiring layer 49 connected to the contact plug CP1 is formed in the surface of the interlayer insulating film 48. The metal wiring layer 49 functions as part of the source line SL. In the interlayer insulating film 48, the contact plug CP2 is also formed, which reaches the impurity diffused layer (drain region) 47 of the selective transistor ST1 on the side of the drain region. Then, the metal wiring layer 50 connected to the contact plug CP2 is formed in the surface of the interlayer insulating film 48.

An interlayer insulating film 51 is formed on the interlayer insulating film 48 by using, for example, $SiO_2$ as its material. An insulating film 52 is formed on the interlayer insulating film 51. The insulating film 52 is formed by using a material higher in dielectric constant than the interlayer insulating film 51, for example, SiN as its material. A metal wiring layer 53 is formed on the insulating film 52. The metal wiring layer 53 functions as the bit line BL. In the insulating film 52 and the interlayer insulating film 51, the contact plug CP3 is formed whose upper surface is in contact with the metal wiring layer 53 and whose bottom surface is in contact with the metal wiring layer 50. In addition, the upper surface of the contact plug CP3 is higher than the upper surface of the insulating film 52. That is, the upper portion of the contact plug CP3 is formed to enter the metal wiring layer 53. Further, an interlayer insulating film 54 is formed on the insulating film 52 and the metal wiring layer 53 by using a material lower in dielectric constant than the insulating film 52, for example, $SiO_2$. The interlayer insulating film 54 fills a region between the adjacent bit lines BL, BL.

That is, the configuration of the above NAND type flash memory on a level higher than the interlayer insulating film 48 is equal to a configuration in which the interlayer insulating film 6, the insulating film 7, the contact plug 3, the metal wiring layer 2, the insulating film 7 and the interlayer insulating films 10 described in the first embodiment are replaced with the interlayer insulating film 51, the insulating film 52, the contact plug CP3, the bit line BL, the insulating film 52 and the interlayer insulating film 54. Thus, the NAND type flash memory according to the present embodiment can also be formed by the method in FIGS. 3A to 3C through FIGS. 10A to 10C described in the first embodiment.

In the NAND type flash memory according to the present embodiment, the effects (1), (2) described in the first embodiment can be obtained. In particular, higher integration is required in the NAND type flash memory, and the associated miniaturization of wiring lines including the transistors has been progressing. For example, the bit line BL is formed with minimum processing dimensions. As a result, the influence of parasitic capacitance between the bit lines BL, BL becomes prominent, which decreases the semiconductor memory characteristics. However, in the configuration according to the present embodiment, variations of the upper and lower surfaces in the arrangement pitch of the bit lines BL can be inhibited, as described as the effect (1) in the first embodiment. This improves the manufacturing accuracy of the NAND type flash memory, such that its operation reliability can be improved. Moreover, as in the effect (2), a material (the $SiO_2$ film 54) lower in dielectric constant than SiN (the insulating film 52 as an etching stopper) is used as the material of the interlayer insulating film between bit lines. This reduces the capacitance between the bit lines BL and can improve the operation speed of the NAND type flash memory.

Figure 26:
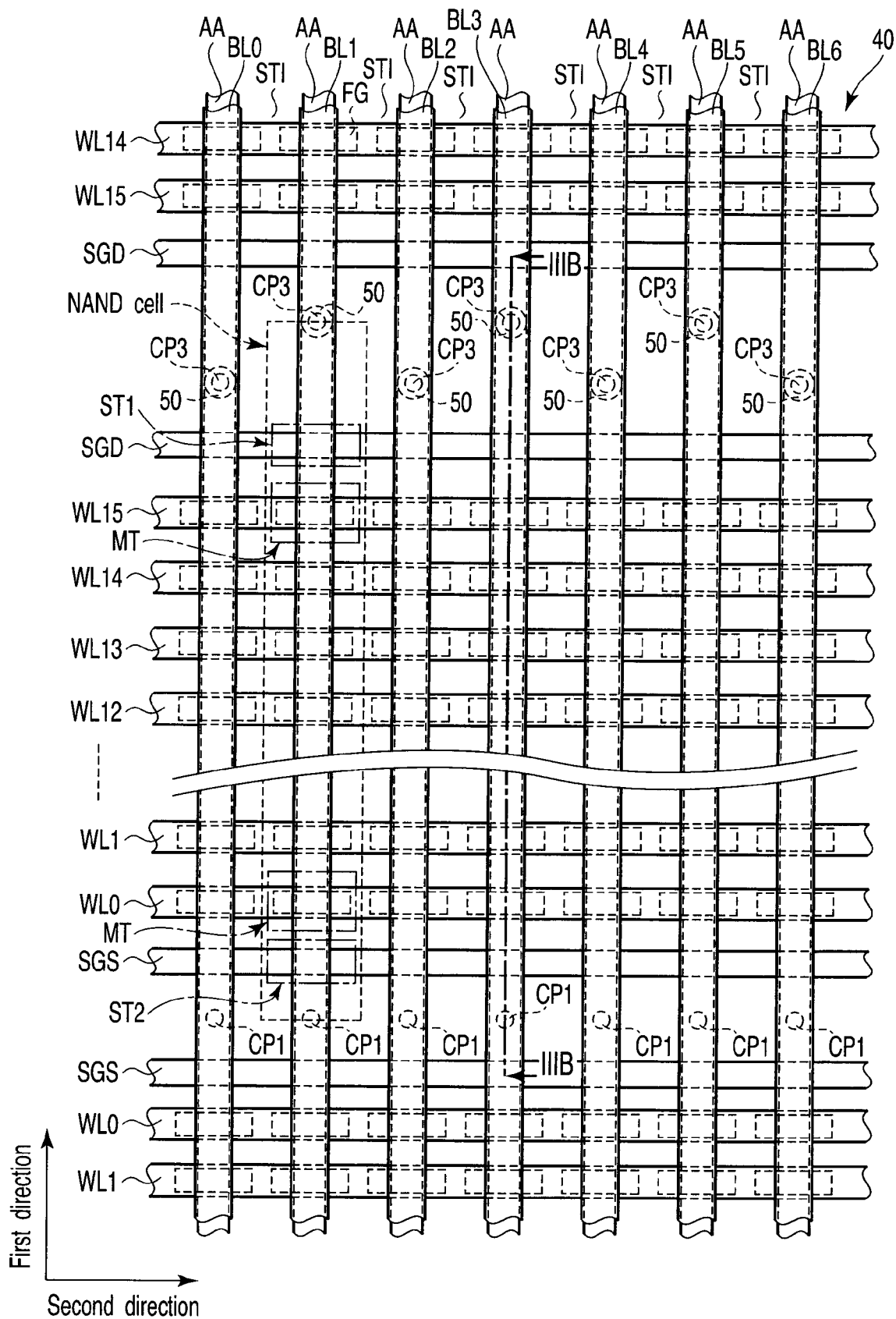
FIG. 26 is a plan view showing an example of the configuration of a memory cell array provided in a NAND type flash memory according to a first modification of the third embodiment of the present invention.

In addition, the contact plugs CP2, CP3 and the metal wiring layer 50 have elliptic sections in the planar direction, and are arranged in a zigzag form in the second direction, in the case described in the present embodiment. However, the present embodiment is not limited to such a case. FIG. 26 to FIG. 28 are plan views of memory cell arrays provided in NAND type flash memories according to first to third modifications of the present embodiment. In addition, FIG. 26 to FIG. 28 are similar to FIG. 24 except for the shape and arrangement of the contact plugs CP2, CP3 and the metal wiring layers 50.

First, as shown in FIG. 26, the contact plugs CP2, CP3 and the metal wiring layer 50 have a circular sectional shape, in contrast with the configuration in FIG. 24 described in the third embodiment.

Furthermore, as shown in FIG. 27, the contact plugs CP2, CP3 and the metal wiring layers 50 may be aligned in the second direction, in contrast with the configuration in FIG. 24.

Moreover, as shown in FIG. 28, the contact plugs CP2, CP3 and the metal wiring layer 50 have a circular sectional shape, in contrast with the configuration shown in FIG. 27.

In addition, as shown in FIG. 26 and FIG. 28, the contact plug CP1 has a circular sectional shape.

Still further, the sectional shape of the contact plugs CP2, CP3 and the metal wiring layer 50 in the planar direction is desirably elliptic, which improves the contact area. This holds true with the first and second embodiments. Moreover, the contact plugs CP2, CP3 and the metal wiring layers 50 are desirably arranged in a zigzag form in the second direction. The reason for this is that such an arrangement makes it possible to have a greater space between those adjacent in the second direction and thus effectively prevent the occurrence of a short circuit.

Fourth Embodiment

Next, a semiconductor storage device according to a fourth embodiment of the present invention will be described. In the present embodiment, the configuration described in the second embodiment is applied to a NAND type flash memory. A circuit diagram of a memory cell array provided in the NAND type flash memory according to the present embodiment is similar to that in FIG. 23 described in the third embodiment, and therefore is not explained.

Figure 29:
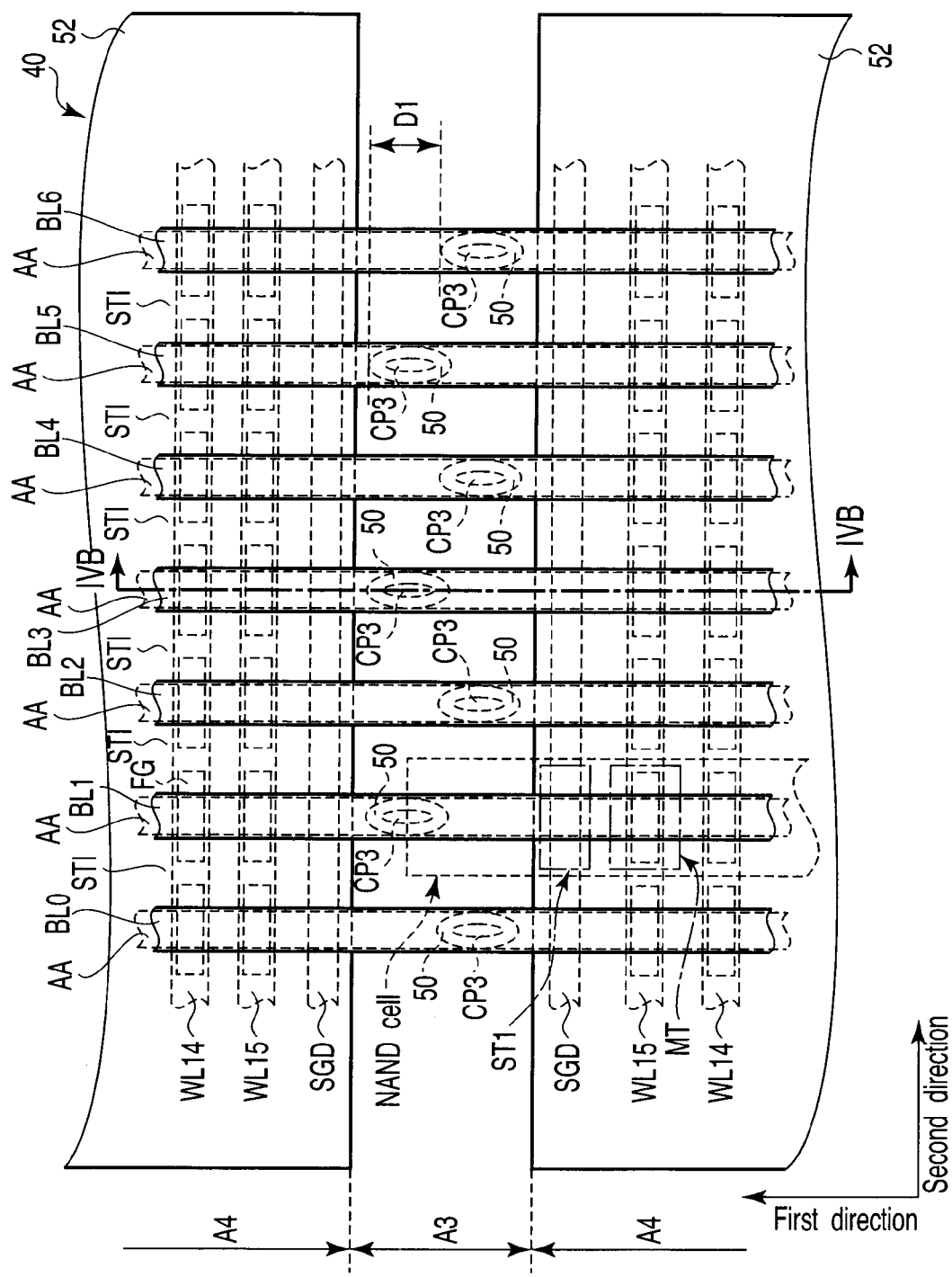
FIG. 29 is a plan view showing an example of the configuration of a memory cell array provided in a NAND type flash memory according to a fourth embodiment of the present invention.
Figure 30:
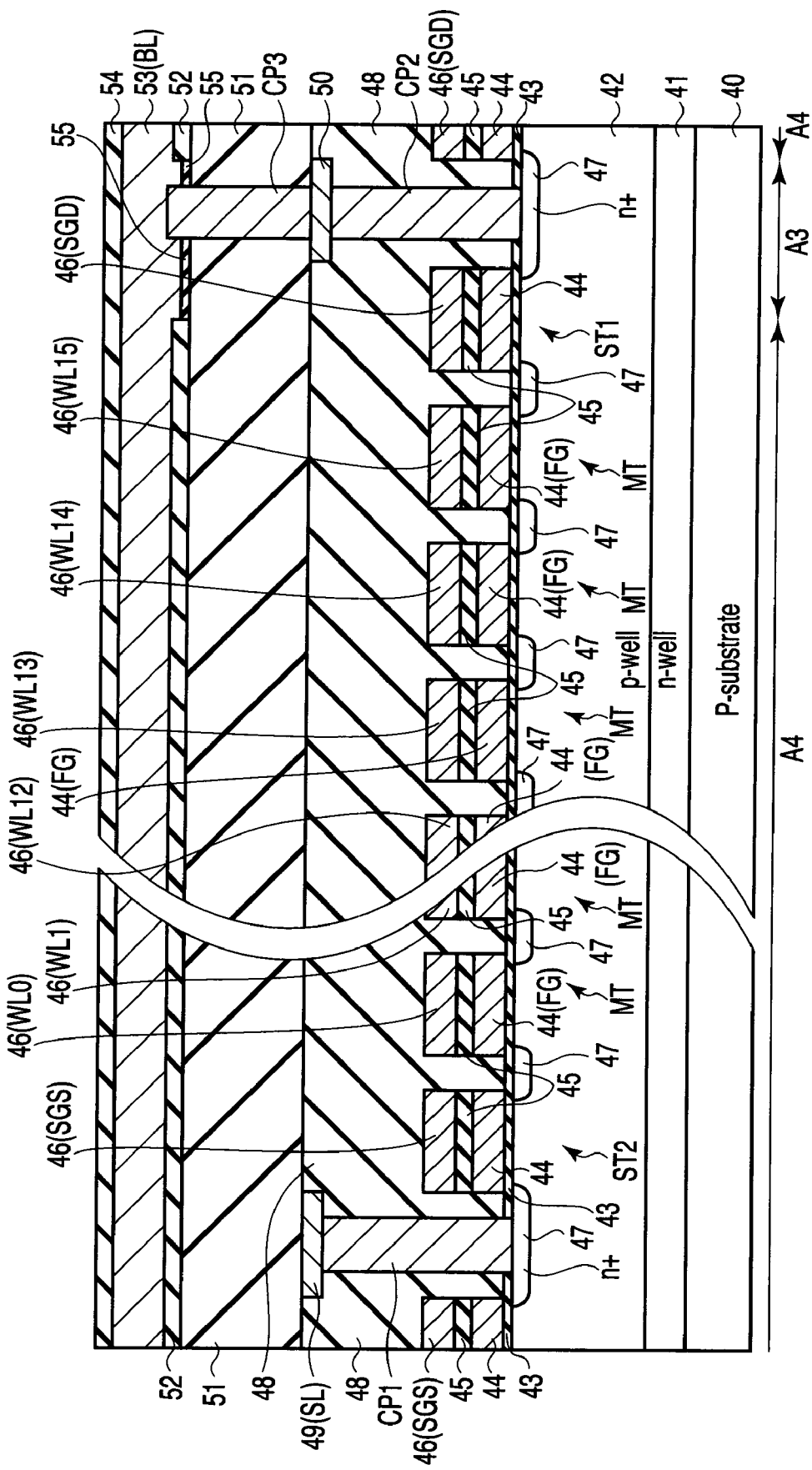
FIG. 30 is a sectional view showing the example of the configuration of the memory cell array provided in the NAND type flash memory according to the fourth embodiment of the present invention, and is a sectional view along the IVB-IVB line in FIG. 29.

FIG. 29 is a plan view of the memory cell array provided in the NAND type flash memory according to the present, and FIG. 30 is a sectional view in a first direction (a bit line/the IVB-IVB line) in FIG. 29. Points different from those in the third embodiment alone are described below. Therefore, FIG. 29 only shows regions around contact plugs CP2, CP3 and the metal wiring layers 50, and other regions are similar to those in FIG. 24. FIG. 29 also shows an insulating film 52.

As shown, the NAND type flash memory according to the present has a configuration in which the insulating film 52 around the contact plug CP3 has been removed, in contrast with the configuration in FIG. 24 and FIG. 25 described in the third embodiment. That is, the insulating film 52 has been removed in a region A3, while the insulating film 52 remains in regions A4, wherein a region between adjacent two select gate lines SGD, SGD is referred to as the region A3, and other regions (regions in which selective transistors ST1, ST2 and memory cell transistors MT are formed) are referred to as the regions A4. That is, the strip of insulating film 52 has been removed in the second direction in the region A3 (see FIG. 29).

Thus, as shown in FIG. 30, in the region A3, an interlayer insulating film 55 using, for example, $SiO_2$ as its material is formed on an interlayer insulating film 51, and a metal wiring layer 53 serving as a bit line BL is formed on the interlayer insulating film 55. Then, the bottom of the bit line BL in the region A3 is located deeper than the bottom of the bit line BL in the regions A4.

That is, the configuration of the above NAND type flash memory on a level higher than an interlayer insulating film 48 is equal to a configuration in which the interlayer insulating film 6, the insulating film 7, the interlayer insulating film 8, the contact plug 3, the metal wiring layer 2 and the interlayer insulating films 10 described in the second embodiment are replaced with the interlayer insulating film 51, the insulating film 52, the interlayer insulating film 55, the contact plug CP3, the bit line BL and the interlayer insulating film 54. Thus, the method described in the second embodiment is applicable to the manufacture of a NAND type flash memory according to the present embodiment.

The NAND type flash memory described above makes it possible to obtain both the effects (1), (2) described in the first embodiment and the effects (3), (4) described in the second embodiment.

The effects (1), (2) are as described in the third embodiment. Moreover, a large number of contact plugs CP3 are formed with minimum processing dimensions especially in the NAND type flash memory. Therefore, when the SiN film 52 is present between the adjacent contact plugs CP3, CP3, a slight amount of current runs in a wide region including the regions around the contact plugs CP3, which may increase the power consumption of the NAND type flash memory.

However, in the present embodiment, part of the insulating film 52 has been removed in the regions around the contact plugs CP3. Thus, as has been described as the effect (3) in the second embodiment, it is possible to reduce the current running across the adjacent contact plugs CP3, CP3, such that the power consumption of the whole NAND type flash memory can be reduced. It should be understood that, as has been described as the effect (4), a similar structure can be obtained with a smaller number of steps than in the second embodiment, so that the manufacturing process can be simplified, and the manufacturing cost can be reduced.

Figure 31:
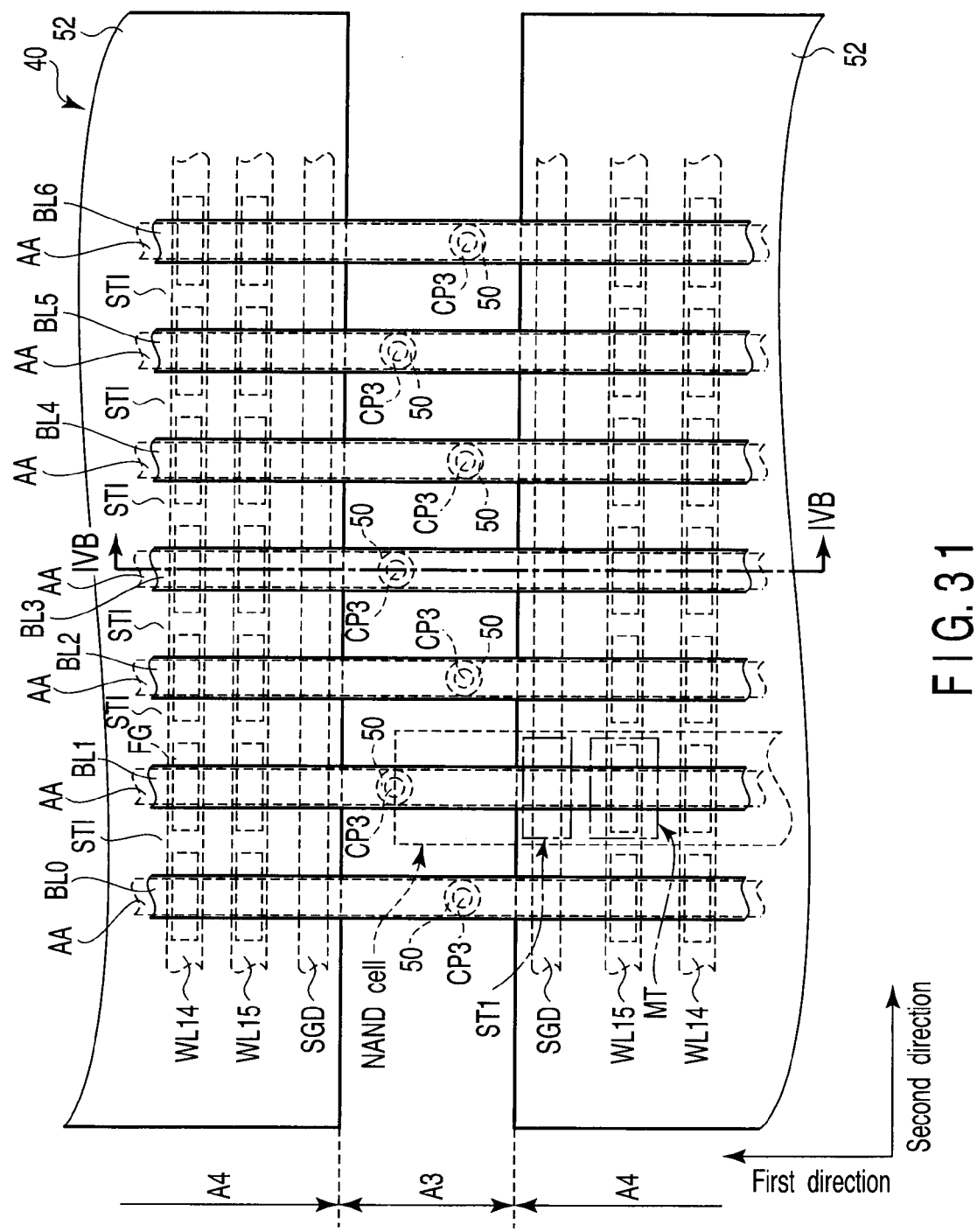
FIG. 31 is a plan view showing an example of the configuration of a memory cell array provided in a NAND type flash memory according to a first modification of the fourth embodiment of the present invention.
Figure 33:
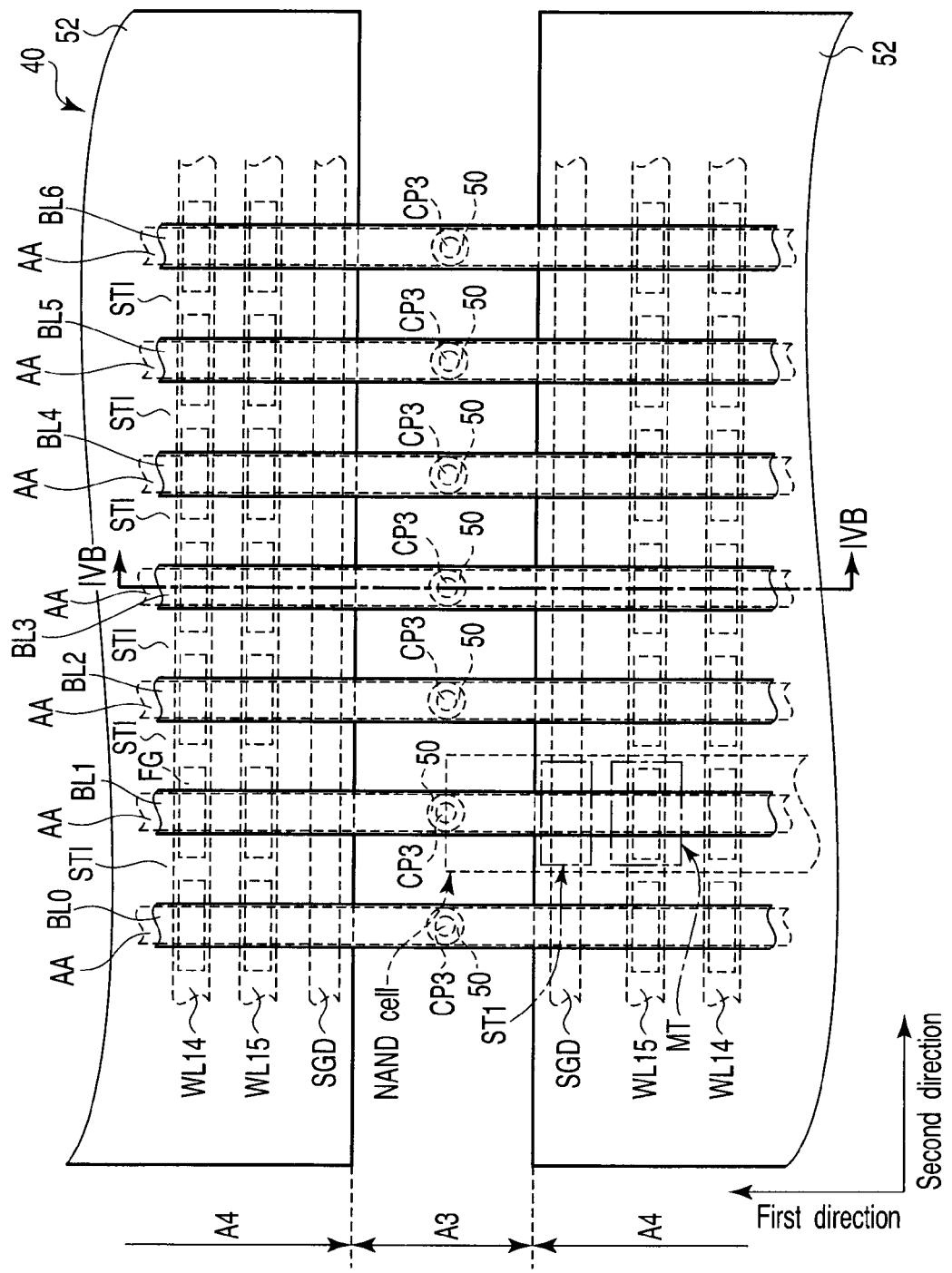
FIG. 33 is a plan view showing an example of the configuration of a memory cell array provided in a NAND type flash memory according to a third modification of the fourth embodiment of the present invention.

In addition, in the present embodiment, various methods can be applied to the planar sectional shape and arrangement of the contact plugs CP2, CP3 and the metal wiring layers 50. FIG. 31 to FIG. 33 are plan views of NAND type flash memories according to first to third modifications of the present embodiment.

First, as shown in FIG. 31, the contact plugs CP2, CP3 and the metal wiring layer 49, 50 have a circular sectional shape, in contrast with the configuration in FIG. 29.

Furthermore, as shown in FIG. 32, the contact plugs CP2, CP3 and the metal wiring layers 50 may be aligned in the second direction, in contrast with the configuration in FIG. 29.

Moreover, as shown in FIG. 33, the contact plugs CP2, CP3 and the metal wiring layer 50 have a circular sectional shape, in contrast with the configuration in FIG. 32.

As described above, in the semiconductor device and the semiconductor storage device according to the first to fourth embodiments of the present invention, the insulating films 7, 52 serve as the etching stoppers during the formation of the grooves to embed the metal wiring layers 2, 53. Therefore, the depths of the grooves 14 are substantially uniform. This enables an improvement in the accuracy of the formation of the metal wiring layers 2, 53. As a result, it is possible to inhibit variations in inter-wiring capacitance and improve the characteristics of the semiconductor device and the semiconductor storage device.

Furthermore, in the configurations according to the first to fourth embodiments, the SiN film 7 higher in dielectric constant than the $SiO_2$ film is not present between the adjacent metal wiring layers 2, 2 and between the adjacent bit lines BL, BL. As a result, the inter-wiring capacitance between the metal wiring layers 2, 2 and between the bit lines BL, BL is reduced. Further, the reduction of the inter-wiring capacitance makes it possible to suppress signal delays in the metal wiring layer 2 and the bit line BL.

In addition, the adjacent contact plugs 3, CP3 are preferably arranged in a zigzag form (see FIG. 1, FIG. 13, FIG. 24, FIG. 26, FIG. 29 and FIG. 31). This makes it possible to effectively prevent a short circuit between the contact plugs 3, CP3. At this point, the contact plugs 3, CP3 adjacent in the second direction have only to be displaced with respect to each other in the first direction. That is, as shown in, for example, the plan view of FIG. 29, a displacement width D1 (D1>0) in the first direction is enough. Although a greater displacement width D1 prevents a short circuit more effectively, the size of the displacement width D1 can be suitably selected depending on, for example, the space between the adjacent bit lines BL or the intensity of a voltage applied to the bit lines BL.

Furthermore, a NAND type flash memory has been described by way of example in the third and fourth embodiments. As a NAND type flash memory, it is also possible to apply a 3Tr-NAND type flash memory having one memory cell transistor, or a 2Tr-type flash memory from which a selective transistor ST1 on the side of a drain region in the 3Tr-NAND type flash memory has been removed. The present invention can also be applied to a NOR type flash memory, and can be widely applied to nonvolatile semiconductor memories having stacked gate structures in general.

Especially in the NAND type flash memory, a high voltage of about 20 to 25 V is applied to the word line in, for example, writing. Thus, a short circuit easily occurs in the metal wiring layer in a word line driver which applies the voltage to the word line. It is therefore desirable to apply the configurations described in the first to fourth embodiments to the metal wiring layer in the word line driver.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor storage device comprising:
a memory cell transistor formed on a semiconductor substrate;
a selective transistor which is formed on the semiconductor substrate and whose source is connected to a drain of the memory cell transistor;
a first interlayer insulating film which is formed on the semiconductor substrate and which covers the memory cell transistor and the selective transistor;
a first insulating layer formed on the first interlayer insulating film by use of a material higher in dielectric constant than the first interlayer insulating film;
a second insulating layer formed on the first insulating layer and including a material lower in dielectric constant than the first insulating layer;
a contact plug which penetrates the first insulating layer and which is provided in the first interlayer insulating film and which is electrically connected to a drain of the selective transistor; and
a bit line which is formed on the first insulating layer, which is extended along the memory cell transistor and the selective transistor and which is in contact with the contact plug,
wherein, in a cross section of the bit line, a bottom surface of the bit line is located lower than an upper surface of the contact plug, the bit line is in contact with a side surface of the contact plug and is in direct contact with an upper surface of the first insulating film, and the bit line is also in contact with a side surface of the second insulating layer.

2. The semiconductor storage device according to claim 1, wherein the first insulating layer is formed by use of SiN.

3. The semiconductor storage device according to claim 1, wherein the first insulating layer is formed by use of SiCN.

4. The semiconductor storage device according to claim 1, wherein the first insulating layer is formed by use of a stack film of SiN and SiCN.

5. The semiconductor storage device according to claim 1, wherein the partial region in the bottom surface of the bit line is in a second interlayer insulating film provided at an upper surface of the first insulating layer.

6. The semiconductor storage device according to claim 1, wherein the sectional shape of the contact plug in a planar direction is elliptic.

7. The semiconductor storage device according to claim 1, wherein the contact plug has a circular sectional shape.

8. The semiconductor storage device according to claim 1, wherein a plurality of contact plugs and a plurality of bit lines are provided, and the plurality of contact plugs are arranged in a zigzag form in a direction intersecting with the wiring direction of the plurality of bit lines.

9. The semiconductor storage device according to claim 1, wherein a plurality of contact plugs and a plurality of bit lines are provided, and the plurality of contact plugs are aligned in a direction intersecting with the wiring direction of the plurality of bit lines.

10. The semiconductor device according to claim 1, wherein a partial region in the bottom surface of the bit line is lower than an upper surface of the first insulating layer.

11. The device according to claim 1, wherein the second insulating layer includes $SiO_2$.

12. The device according to claim 1, wherein the device is a NAND Flash memory.

* * * * *